United States Patent [19]
Rudeseal et al.

[11] Patent Number: 5,239,659
[45] Date of Patent: Aug. 24, 1993

[54] PHANTOM DUPLEX COPY GROUP APPARATUS FOR A DISK DRIVE ARRAY DATA STORGE SUBSYSTEM

[75] Inventors: George A. Rudeseal, Boulder; Henry S. Ludlam, Longmont; Jay S. Belsan, Nederland, all of Colo.

[73] Assignee: Storage Technology Corporation, Louisville, Colo.

[21] Appl. No.: 717,820

[22] Filed: Jun. 19, 1991

[51] Int. Cl.[5] .................. G06F 12/16; G06F 13/00; G06F 11/80

[52] U.S. Cl. .................. 395/800; 395/500; 364/232.3; 364/246.92; 364/268; 364/927.81; 364/DIG. 1; 364/DIG. 2; 371/10.1

[58] Field of Search .............. 395/DIG. 1 MS File, 395/DIG. 2 MS File, 500, 575, 600, 800; 371/10.1, 40.1, 10.2, 40.4

[56] References Cited

U.S. PATENT DOCUMENTS

| | | | |
|---|---|---|---|
| 4,837,680 | 6/1989 | Crockett et al. | 395/DIG. 1 |
| 4,914,656 | 4/1990 | Dunphy, Jr. et al. | 371/10.2 |
| 4,989,205 | 1/1991 | Dunphy, Jr. et al. | 371/10.1 |
| 5,077,736 | 12/1991 | Dunphy, Jr. et al. | 371/10.1 |
| 5,124,987 | 6/1992 | Milligan et al. | 371/10.1 |

OTHER PUBLICATIONS

International Business Machines Corporation; "IBM 3990 Storage Control Introduction"; Sep. 1987; pp. iii-89.

Primary Examiner—Robert B. Harrell
Attorney, Agent, or Firm—Duft, Graziano & Forest

[57] ABSTRACT

This apparatus makes use of a disk drive array to store data records for an associated host processor. This disk drive array emulates the operation of a large form factor disk drive by using a plurality of interconnected small form factor disk drives. These small form factor disk drives are configured into redundancy groups, each of which contains n+m disk drives for storing data records and redundancy information thereon. The use of this configuration is significantly more reliable than a large form factor disk drive. However, in order to maintain compatibility with host processors that request the duplex copy group feature, the phantom duplex copy group apparatus of the present invention mimics the creation of a duplex copy group in this dynamically mapped data storage subsystem using a disk array and a phantom set of pointers that mimic the data storage devices on which the data records are stored.

36 Claims, 10 Drawing Sheets

| | |
|---|---|
| 1001 --- | HOST PROCESSOR TRANSMITS "CREATE DUPLEX COPY GROUP" CHANNEL COMMAND TO DATA STORAGE SUBSYSTEM DEFINING PRIMARY AND SECONDARY DEVICES |
| 1002 --- | DATA STORAGE SUBSYSTEM ESTABLISHES A PRIMARY VIRTUAL DATA STORAGE DEVICE USING DYNAMICALLY MAPPED DISK DRIVES WITH ASSOCIATED MAPPING TABLES TO EMULATE HOST PROCESSOR DEFINED PRIMARY DATA STORAGE DEVICE |
| 1003 --- | DATA STORAGE SUBSYSTEM ESTABLISHES A SECONDARY VIRTUAL DATA STORAGE DEVICE TO EMULATE HOST PROCESSOR DEFINED SECONDARY DATA STORAGE DEVICE BY DEFINING A PHANTOM DEVICE WHICH POINTS TO THE PRIMARY VIRTUAL DATA STORAGE DEVICE |
| 1004 --- | HOST PROCESSOR TRANSMITS "SUSPEND DUPLEX COPY GROUP" CHANNEL COMMAND TO DATA STORAGE SUBSYSTEM |
| 1005 --- | DATA STORAGE SUBSYSTEM COPIES PRIMARY VIRTUAL DATA STORAGE DEVICE MAPPING TABLES AND ASSOCIATES THE COPIED TABLES WITH THE DEFINED SECONDARY VIRTUAL DATA STORAGE DEVICE |
| 1006 --- | HOST PROCESSOR TRANSMITS "REESTABLISH SUSPENDED DUPLEX COPY GROUP" CHANNEL COMMAND TO DATA STORAGE SUBSYSTEM DEFINING PRIMARY DEVICE TO REESTABLISH THE ORIGINALLY DEFINED DUPLEX COPY PAIR |
| 1007 --- | DATA STORAGE SUBSYSTEM DELETES MAPPING TABLES FOR DESIGNATED SECONDARY DEVICE |
| 1008 --- | HOST PROCESSOR TRANSMITS "TERMINATE DUPLEX COPY GROUP "CHANNEL COMMAND TO DATA STORAGE SUBSYSTEM |
| 1009 --- | DATA STORAGE SUBSYSTEM TERMINATES DUPLEX COPY GROUP |

FIG 10

PHANTOM DUPLEX COPY GROUP APPARATUS FOR A DISK DRIVE ARRAY DATA STORGE SUBSYSTEM

BACKGROUND OF THE INVENTION

This invention relates to data storage subsystems and, in particular, to an improved facility for providing redundant copies of data records for an associated host processor.

It is a problem in the field of data storage subsystems to reliably store data on the data storage media in a fault tolerant manner. Peripheral data storage subsystems typically use magnetic disk drives to store data records thereon for an associated host processor. A control unit is used to interconnect the host processor to a plurality of disk drives. In these data storage subsystems, improved data storage reliability can be obtained by the use of dual copies, wherein duplicate copies of a data record are stored on different disk drives within the data storage subsystem. One example of dual copy capability is disclosed in U.S. Pat. No. 4,837,680, issued Jun. 6, 1989 to N. Crockett et al. The dual copy feature is typically provided in response to the host processor transmitting a "define duplex copy group" system command which designates one of the disk drives as the primary data storage device. The host processor also selects a secondary data storage device to maintain a duplicate copy of each data record written by the host processor to the primary data storage device. Therefore, each data record transmitted by the host processor to the control unit for storage on the primary data storage device is also written by the control unit to the secondary data storage device. This configuration maintains two copies of each data record, with the copies being stored on physically different disk drives behind a single control unit. In the event that one of the disk drives fails, the data record is still available to the host processor on the other disk drive in this duplex copy group. This arrangement significantly improves the reliability of the data storage subsystem, but doubles the cost of storing data because of the need for two separate disk drives.

SUMMARY OF THE INVENTION

The above described problems are solved and a technical advance achieved by the phantom duplex copy subsystem. This apparatus makes use of a disk drive array to store the data records for the associated host processor. This disk drive array emulates the operation of a large form factor disk drive by using a plurality of interconnected small form factor disk drives. These small form factor disk drives are configured into redundancy groups, each of which contains n+m disk drives for storing data records and redundancy information thereon. Each redundancy group, also called a logical disk drive, is divided into a number of logical cylinders, each containing i logical tracks, one logical track for each of the i physical tracks contained in a cylinder of one physical disk drive. Each logical track is comprised of n+m physical tracks, one physical track from each disk drive in the redundancy group. The n+m disk drives are used to store n data segments, one on each of n physical tracks per logical track, and to store m redundancy segments, one on each of m physical tracks per logical track in the redundancy group. The n+m disk drives in a redundancy group have unsynchronized spindles and loosely coupled actuators. The data is transferred to the disk drives via independent reads and writes since all disk drives operate independently.

The disk drive array data storage subsystem is a dynamically mapped system, and virtual devices are defined in the storage control unit contained therein. Each virtual device is the image of a disk drive presented to the host processor over the channel interface. A virtual device is a host-addressable entity with host-controlled content and host-managed space allocation. In this system, the virtual device consists of a mapping of a large form factor disk drive image onto a plurality of small form factor disk drives which constitute at least one redundancy group within the disk drive array. The virtual to physical mapping is accomplished by the use of a Virtual Device Table (VDT) entry which represents the virtual device. The "realization" of the virtual device is the set of Virtual Track Directory (VTD) entries, associated with the VDT entry each of which VTD entries contains data indicative of the Virtual Track Instances, which are the physical storage locations in the disk drive array redundancy group that contain the data records.

The use of this configuration is significantly more reliable than a large form factor disk drive. However, in order to maintain compatibility with host processors that request the duplex copy group feature, the phantom duplex copy group apparatus of the present invention mimics the creation of a duplex copy group in this dynamically mapped data storage subsystem using a disk array and a phantom set of pointers that mimic the data storage devices on which the data records are stored. In response to the host processor requesting the activation of the duplex copy group capability and the associated designation of primary and secondary disk drives to store the data thereon, the apparatus of the present invention implements the host processor request by configuring a pair of virtual devices to perform as if they were primary and secondary large form factor disk drives.

The use of redundancy groups with their associated redundancy data obviates the need for a secondary disk drive to provide data backup as requested by the host processor. Therefore, in order to maximize the data storage capability of the data storage subsystem, a second physical copy of the data record is not created within the data storage subsystem. Instead, in order to emulate the duplex copy group capability of a standard data storage subsystems, the present apparatus links together a primary and a secondary Virtual Device Table entry in response to the host processor requesting activation of the duplex copy group capability. The implementation of the primary device consists of a Virtual Device Table entry in the storage control unit which points to a set of Virtual Track Directory entries. These entries in the virtual track directory map the track image of the virtual device to physical storage locations in at least one selected redundancy group in the disk drive array. The secondary data storage device designated by the host processor is implemented by a Virtual Device Table entry which does not contain any associated physical data storage capability. Instead, the secondary virtual device definition in the storage control unit simply points to the primary virtual device definition in the storage control unit and contains no virtual track directory entries associated therewith independent of those assigned to the primary virtual device. In this manner, the disk drive array data storage subsystem emulates the operation of the duplex copy group feature as requested by the host processor yet does not require the physical replication of the data records in order to provide the reliability and two physical copies of the duplex copy group feature in the large form factor disk drive data storage subsystems.

BRIEF DESCRIPTION OF THE DRAWING

FIG. 10 illustrates, in flow diagram form, the operation of the phantom duplex copy group operation.

DETAILED DESCRIPTION OF THE INVENTION

Figure 1:
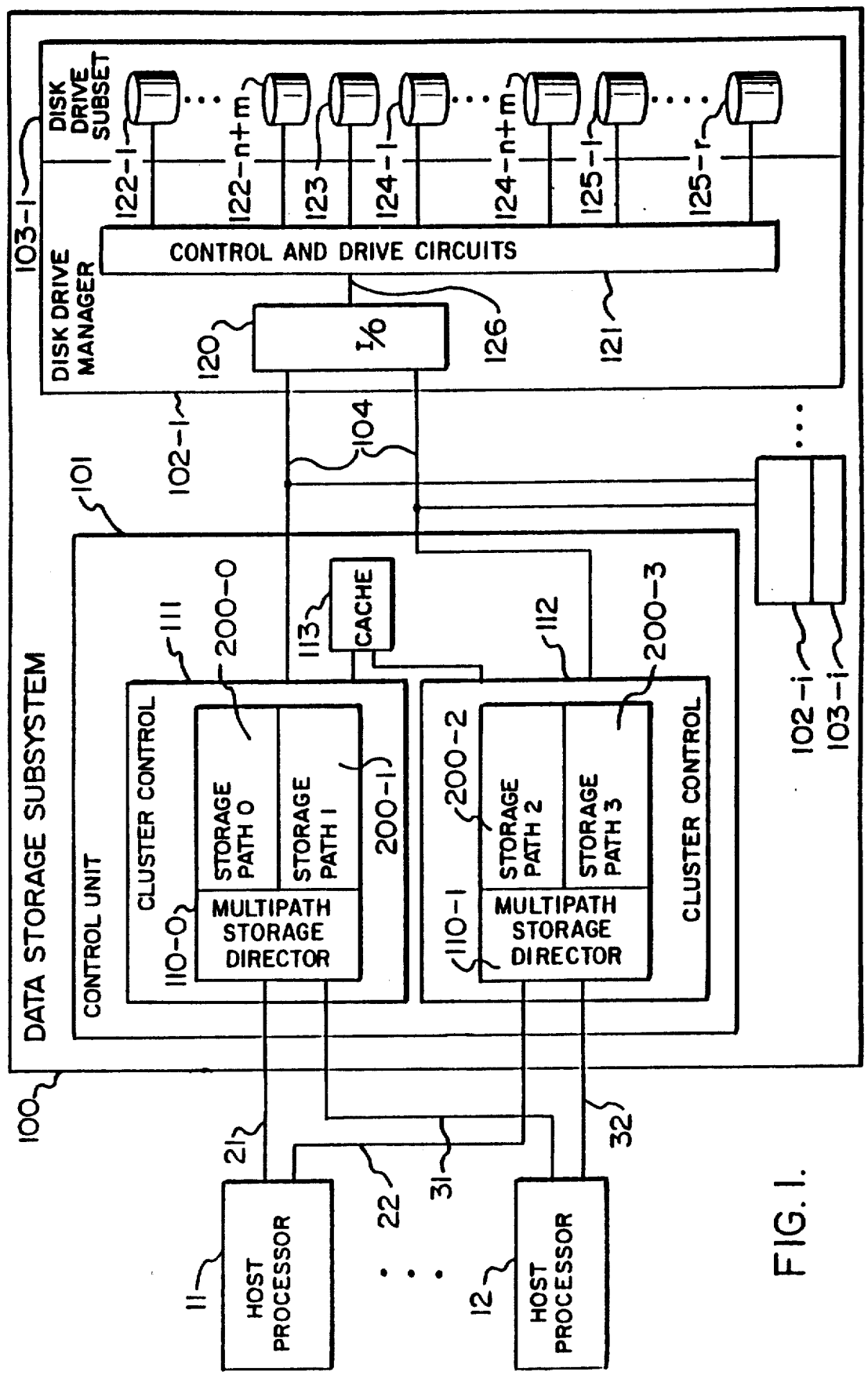
FIG. 1 illustrates in block diagram form the architecture of the disk drive array data storage subsystem.

The data storage subsystem of the present invention uses a plurality of small form factor disk drives in place of a single large form factor disk drive to implement an inexpensive, high performance, high reliability disk drive memory that emulates the format and capability of large form factor disk drives. This system avoids the parity update problem of the prior art disk drive array systems by never updating the parity. Instead, all new or modified data is written on empty logical tracks and the old data is tagged as obsolete. The resultant "holes" in the logical tracks caused by old data are removed by a background free-space collection process that creates empty logical tracks by collecting valid data into previously emptied logical tracks.

The plurality of disk drives in the disk drive array data storage subsystem are configured into a plurality of variable size redundancy groups of n+m parallel connected disk drives to store data thereon. Each redundancy group, also called a logical disk drive, is divided into a number of logical cylinders, each containing i logical tracks, one logical track for each of the i physical tracks contained in a cylinder of one physical disk drive. Each logical track is comprised of n+m physical tracks, one physical track from each disk drive in the redundancy group. The n+m disk drives are used to store n data segments, one on each of n physical tracks per logical track, and to store m redundancy segments, one on each of m physical tracks per logical track in the redundancy group. The n+m disk drives in a redundancy group have unsynchronized spindles and loosely coupled actuators. The data is transferred to the disk drives via independent reads and writes since all disk drives operate independently.

In addition, a pool of r globally switchable backup disk drives is maintained in the data storage subsystem to automatically substitute a replacement disk drive for a disk drive in any redundancy group that fails during operation. The pool of r backup disk drives provides high reliability at low cost. Each physical disk drive is designed so that it can detect a failure in its operation, which allows the m redundancy segments per logical track to be used for multi-bit error correction. Identification of the failed physical disk drive provides information on the bit position of the errors in the logical track and the redundancy data provides information to correct the errors. Once a failed disk drive in a redundancy group is identified, a backup disk drive from the shared pool of backup disk drives is automatically switched in place of the failed disk drive. Control circuitry reconstructs the data stored on each physical track of the failed disk drive, using the remaining n−1 physical tracks of data plus the associated m physical tracks containing redundancy segments of each logical track. The reconstructed data is then written onto the substitute disk drive.

This apparatus makes use of a disk drive array to store the data records for the associated host processor. This disk drive array emulates the operation of a large form factor disk drive by using a plurality of interconnected small form factor disk drives. These small form factor disk drives are configured into redundancy groups, each of which contains n+m disk drives for storing data records and redundancy information thereon. Each redundancy group, also called a logical disk drive, is divided into a number of logical cylinders, each containing i logical tracks, one logical track for each of the i physical tracks contained in a cylinder of one physical disk drive. Each logical track is comprised of n+m physical tracks, one physical track from each disk drive in the redundancy group. The n+m disk drives are used to store n data segments, one on each of n physical tracks per logical track, and to store m redundancy segments, one on each of m physical tracks per logical track in the redundancy group. The n+m disk drives in a redundancy group have unsynchronized spindles and loosely coupled actuators. The data is transferred to the disk drives via independent reads and writes since all disk drives operate independently.

The disk drive array data storage subsystem is a dynamically mapped system, and virtual devices are defined in the storage control unit contained therein. Each virtual device is the image of a disk drive presented to the host processor over the channel interface. A virtual device is a host-addressable entity with host-controlled content and host-managed space allocation. In this system, the virtual device consists of a mapping of a large form factor disk drive image onto a plurality of small form factor disk drives which constitute at least one redundancy group within the disk drive array. The virtual to physical mapping is accomplished by the use of a Virtual Device Table (VDT) entry which represents the virtual device. The "realization" of the virtual device is the set of Virtual Track Directory (VTD) entries, associated with the VDT entry each of which VTD entries contains data indicative of the Virtual Track Instances, which are the physical storage locations in the disk drive array redundancy group that contain the data records.

The use of this configuration is significantly more reliable than a large form factor disk drive. However, in order to maintain compatibility with host processors that request the duplex copy group feature, the phantom duplex copy group apparatus of the present invention mimics the creation of a duplex copy group in this dynamically mapped data storage subsystem using a disk array and a phantom set of pointers that mimic the data storage devices on which the data records are stored. In response to the host processor requesting the activation of the duplex copy group capability and the associated designation of primary and secondary disk drives to store the data thereon, the apparatus of the present invention implements the host processor request by configuring a pair of virtual devices to perform as if they were primary and secondary large form factor disk drives.

The use of redundancy groups with their associated redundancy data obviates the need for a secondary disk drive to provide data backup as requested by the host processor. Therefore, in order to maximize the data storage capability of the data storage subsystem, a second physical copy of the data record is not created within the data storage subsystem. Instead, in order to emulate the duplex copy group capability of a standard data storage subsystems, the present apparatus links together a primary and a secondary Virtual Device Table entry in response to the host processor requesting activation of the duplex copy group capability. The implementation of the primary device consists of a Virtual Device Table entry in the storage control unit which points to a set of Virtual Track Directory entries. These entries in the virtual track directory map the track image of the virtual device to physical storage locations in at least one selected redundancy group in the disk drive array. The secondary data storage device designated by the host processor is implemented by a Virtual Device Table entry which does not contain any associated physical data storage capability. Instead, the secondary virtual device definition in the storage control unit simply points to the primary virtual device definition in the storage control unit and contains no virtual track directory entries associated therewith independent of those assigned to the primary virtual device. In this manner, the disk drive array data storage subsystem emulates the operation of the duplex copy group feature as requested by the host processor yet does not require the physical replication of the data records in order to provide the reliability and availability of the data heretofore provided by the two physical copies of the duplex copy group feature subsystems.

FIG. 1 illustrates in block diagram form the architecture of the preferred embodiment of the disk drive array data storage subsystem 100. The disk drive array data storage subsystem 100 appears to the associated host processors 11-12 to be a collection of large form factor disk drives with their associated storage control, since the architecture of disk drive array data storage subsystem 100 is transparent to the associated host processors 11-12. This disk drive array data storage subsystem 100 includes a plurality of disk drives (ex 122-1 to 125-r) located in a plurality of disk drive subsets 103-1 to 103-i. The disk drives 122-1 to 125-r are significantly less expensive, even while providing disk drives to store redundancy information and providing disk drives for backup purposes, than the typical 14 inch form factor disk drive with an associated backup disk drive. The plurality of disk drives 122-1 to 125-r are typically the commodity hard disk drives in the 5¼ inch form factor.

The architecture illustrated in FIG. 1 is that of a plurality of host processors 11-12 interconnected via the respective plurality of data channels 21, 22-31, 32, respectively to a data storage subsystem 100 that provides the backend data storage capacity for the host processors 11-12. This basic configuration is well known in the data processing art. The data storage subsystem 100 includes a control unit 101 that serves to interconnect the subsets of disk drives 103-1 to 103-i and their associated drive managers 102-1 to 102-i with the data channels 21-22, 31-32 that interconnect data storage subsystem 100 with the plurality of host processors 11, 12.

Control unit 101 includes typically two cluster controls 111, 112 for redundancy purposes. Within a cluster control 111 the multipath storage director 110-0 provides a hardware interface to interconnect data channels 21, 31 to cluster control 111 contained in control unit 101. In this respect, the multipath storage director 110-0 provides a hardware interface to the associated data channels 21, 31 and provides a multiplex function to enable any attached data channel ex-21 from any host processor ex-11 to interconnect to a selected cluster control 111 within control unit 101. The cluster control 111 itself provides a pair of storage paths 201-0, 201-1 which function as an interface to a plurality of optical fiber backend channels 104. In addition, the cluster control 111 includes a data compression function as well as a data routing function that enables cluster control 111 to direct the transfer of data between a selected data channel 21 and cache memory 113, and between cache memory 113 and one of the connected optical fiber backend channels 104. Control unit 101 provides the major data storage subsystem control functions that include the creation and regulation of data redundancy groups, reconstruction of data for a failed disk drive, switching a spare disk drive in place of a failed disk drive, data redundancy generation, logical device space management, and virtual to logical device mapping. These subsystem functions are discussed in further detail below.

Disk drive manager 102-1 interconnects the plurality of commodity disk drives 122-1 to 125-r included in disk drive subset 103-1 with the plurality of optical fiber backend channels 104. Disk drive manager 102-1 includes an input/output circuit 120 that provides a hardware interface to interconnect the optical fiber backend channels 104 with the data paths 126 that serve control and drive circuits 121. Control and drive circuits 121 receive the data on conductors 126 from input/output circuit 120 and convert the form and format of these signals as required by the associated commodity disk drives in disk drive subset 103-1. In addition, control and drive circuits 121 provide a control signaling interface to transfer signals between the disk drive subset 103-1 and control unit 101. The data that is written onto the disk drives in disk drive subset 103-1 consists of data that is transmitted from an associated host processor 11 over data channel 21 to one of cluster controls 111, 112 in control unit 101. The data is written into, for example, cluster control 111 which stores the data in cache 113. Cluster control 111 stores n physical tracks of data in cache 113 and then generates m redundancy segments for error correction purposes. Cluster control 111 then selects a subset of disk drives (122-1 to 122-n+m) to form a redundancy group to store the received data. Cluster control 111 selects an empty logical track, consisting of n+m physical tracks, in the selected redundancy group. Each of the n physical tracks of the data are written onto one of n disk drives in the selected data redundancy group. An additional m disk drives are used in the redundancy group to store the m redundancy segments. The M redundancy segments include error correction characters and data that can be used to verify the integrity of the n physical tracks that are stored on the n disk drives as well as to reconstruct one or more of the n physical tracks of the data if that physical track were lost due to a failure of the disk drive on which that physical track is stored.

Thus, data storage subsystem 100 can emulate one or more large form factor disk drives (ex — an IBM 3380K type of disk drive) using a plurality of smaller form factor disk drives while providing a high reliability capability by writing the data across a plurality of the smaller form factor disk drives. A reliability improvement is also obtained by providing a pool of r backup disk drives (125-1 to 125-r) that are switchably interconnectable in place of a failed disk drive. Data reconstruction is accomplished by the use of the m redundancy segments, so that the data stored on the remaining functioning disk drives combined with the redundancy information stored in the redundancy segments can be used by control software in control unit 101 to reconstruct the data lost when one or more of the plurality of disk drives in the redundancy group fails (122-1 to 122-n+m). This arrangement provides a reliability capability similar significantly reduced cost over such an arrangement.

Each of the disk drives 122-1 to 125-r in disk drive subset 103-1 can be considered a disk subsystem that consists of a disk drive mechanism and its surrounding control and interface circuitry. The disk drive consists of a commodity disk drive which is a commercially available hard disk drive of the type that typically is used in personal computers. A control processor associated with the disk drive has control responsibility for the entire disk drive and monitors all information routed over the various serial data channels that connect each disk drive 122-1 to 125-r to control and drive circuits 121. Any data transmitted to the disk drive over these channels is stored in a corresponding interface buffer which is connected via an associated serial data channel to a corresponding serial/parallel converter circuit. A disk controller is also provided in each disk drive to implement the low level electrical interface required by the commodity disk drive. The commodity disk drive has an ESDI interface which must be interfaced with control and drive circuits 121. The disk controller provides this function. Disk controller provides serialization and deserialization of data, CRC/ECC generation, checking and correction and NRZ data encoding. The addressing information such as the head select and other type of control signals are provided by control and drive circuits 121 to commodity disk drive 122-1. This communication path is also provided for diagnostic and control purposes. For example, control and drive circuits 121 can power a commodity disk drive down when the disk drive is in the standby mode. In this fashion, commodity disk drive remains in an idle state until it is selected by control and drive circuits 121.

Figure 2:
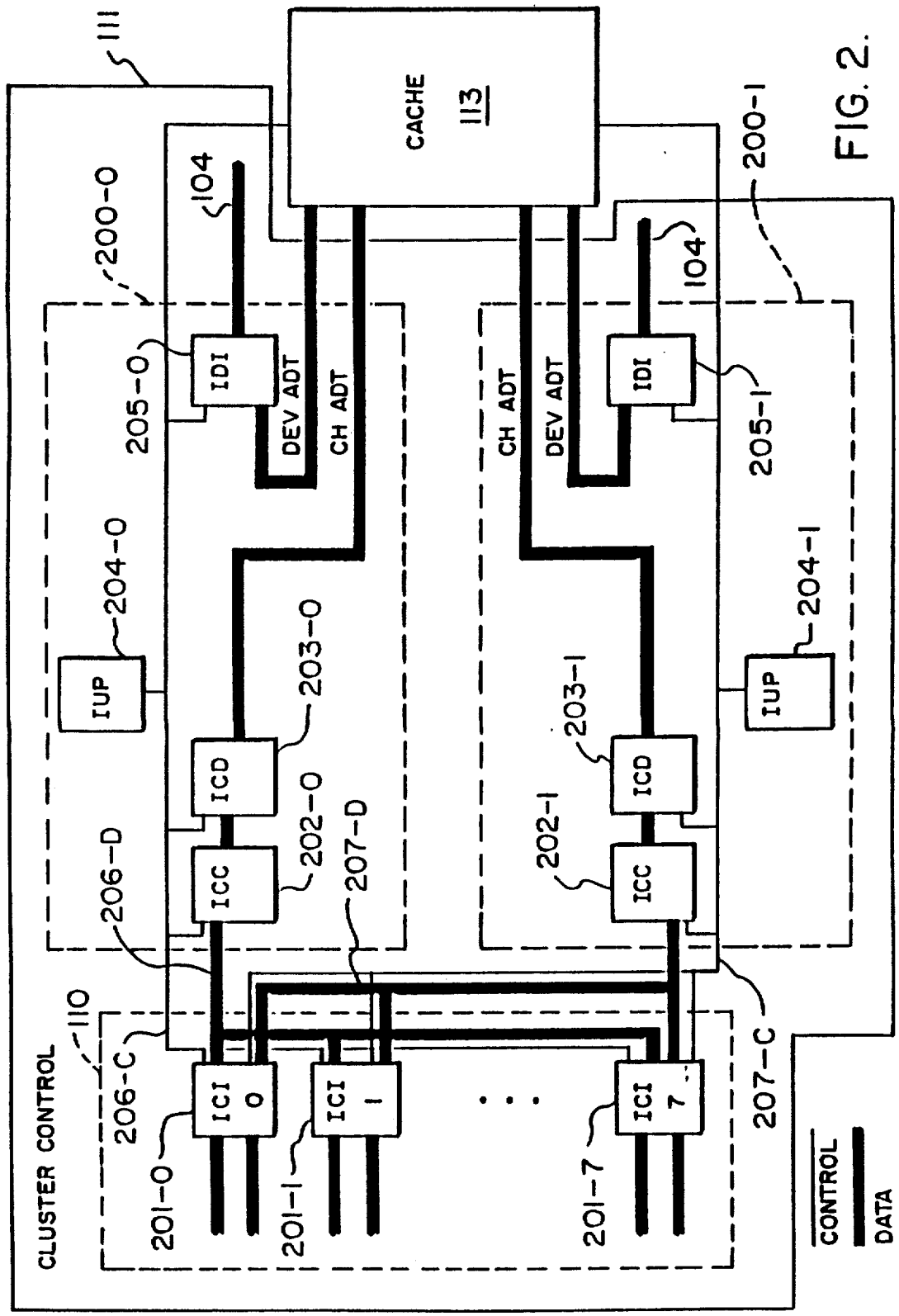
FIG. 2 illustrates the cluster control of the data storage subsystem.

FIG. 2 illustrates in block diagram form additional details of cluster control 111. Multipath storage director 110 includes a plurality of channel interface units 201-0 to 201-7, each of which terminates a corresponding pair of data channels 21, 31. The control and data signals received by the corresponding channel interface unit 201-0 are output on either of the corresponding control and data buses 206-C, 206-D, or 207-C, 207-D, respectively, to either storage path 200-0 or storage path 200-1. Thus, as can be seen from the structure of the cluster control 111 illustrated in FIG. 2, there is a significant amount of symmetry contained therein. Storage path 200-0 is identical to storage path 200-1 and only one of these is described herein. The multipath storage director 110 uses two sets of data and control busses 206-D, C and 207-D, C to interconnect each channel interface unit 201-0 to 201-7 with both storage path 200-0 and 200-1 so that the corresponding data channel 21 from the associated host processor 11 can be switched via either storage path 200-0 or 200-1 to the plurality of optical fiber backend channels 104. Within storage path 200-0 is contained a processor 204-0 that regulates the operation of storage path 200-0. In addition, an optical device interface 205-0 is provided to convert between the optical fiber signalling format of optical fiber backend channels 104 and the metallic conductors contained within storage path 200-0. Channel interface control 202-0 operates under control of processor 204-0 to control the flow of data to and from cache memory 113 and one of the channel interface units 201 that is presently active with storage path 200-0. The channel interface control 202-0 includes a cyclic redundancy check (CRC) generator/checker to generate and check the CRC bytes for the received data. The channel interface circuit 202-0 also includes a buffer that compensates for speed mismatch between the data transmission rate of the data channel 21 and the available data transfer capability of the cache memory 113. The data that is received by the channel interface control circuit 202-0 from a corresponding channel interface circuit 201 is forwarded to the cache memory 113 via channel data compression circuit 203-0. The channel data compression circuit 203-0 provides the necessary hardware and microcode to perform compression of the channel data for the control unit 101 on a data write from the host processor 11. It also performs the necessary decompression operation for control unit 101 on a data read operation by the host processor 11.

As can be seen from the architecture illustrated in FIG. 2, all data transfers between a host processor 11 and a redundancy group in the disk drive subsets 103 are routed through cache memory 113. Control of cache memory 113 is provided in control unit 101 by processor 204-0. The functions provided by processor 204-0 include initialization of the cache directory and other cache data structures, cache directory searching and management, cache space management, cache performance improvement algorithms as well as other cache control functions. In addition, processor 204-0 creates the redundancy groups from the disk drives in disk drive subsets 103 and maintains records of the status of those devices. Processor 204-0 also causes the redundancy data across the n data disks in a redundancy group to be generated within cache memory 113 and writes the m segments of redundancy data onto the m redundancy disks in the redundancy group. The functional software in processor 204-0 also manages the mapping from virtual to logical and from logical to physical devices. The tables that describe this mapping are updated, maintained, backed up and occasionally recovered by this functional software on processor 204-0. The free space collection function is also performed by processor 204-0 as well as management and scheduling of the optical fiber backend channels 104. Many of these above functions are well known in the data processing art and are not described in any detail herein.

Figure 3:
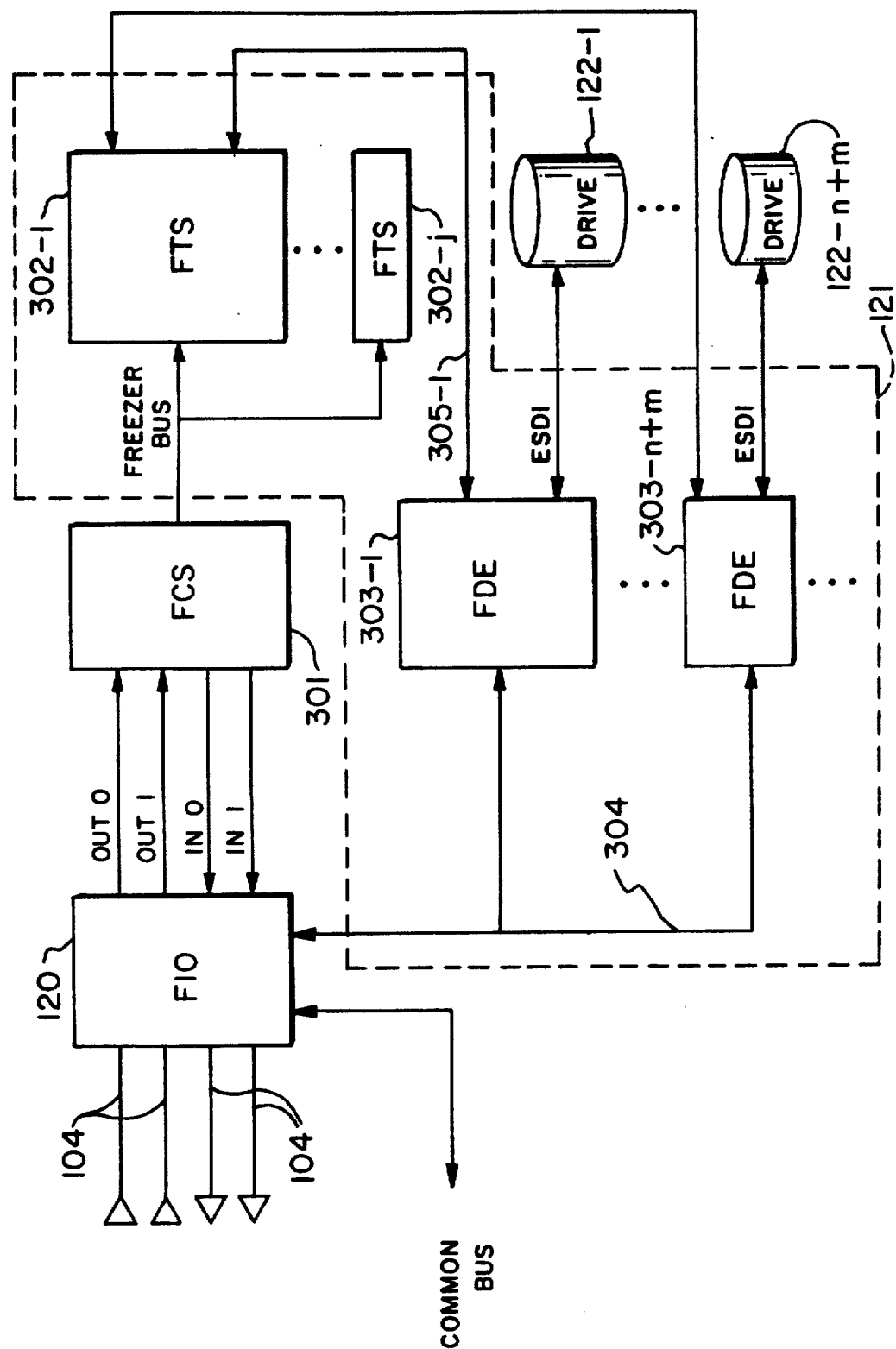
FIG. 3 illustrates the disk drive manager of the data storage subsystem.

FIG. 3 illustrates further block diagram detail of disk drive manager 102-1. Input/output circuit 120 is shown connecting the plurality of optical fiber channels 104 with a number of data and control busses that interconnect input/output circuit 120 with control and drive circuits 121. Control and drive circuits 121 consist of a command and status circuit 301 that monitors and controls the status and command interfaces to the control unit 101. Command and status circuit 301 also collects data from the remaining circuits in disk drive managers 102 and the various disk drives in disk drive subsets 103 for transmission to control unit 101. Control and drive circuits 121 also include a plurality of drive electronics circuits 303, one for each of the commodity disk drives that is used in disk drive subset 103-1. The drive electronics circuits 303 control the data transfer to and from the associated commodity drive via an ESDI interface. The drive electronics circuit 303 is capable of transmitting and receiving frames on the serial interface and contains a microcontroller, track buffer, status and control registers and industry standard commodity drive interface. The drive electronics circuit 303 receives data from the input/output circuit 120 via an associated data bus 304 and control signals via control leads 305. Control and drive circuits 121 also include a plurality of subsystem circuits 302-1 to 302-j, each of which controls a plurality of drive electronics circuits 303. The subsystem circuit 302 controls the request, error and spin up lines for each drive electronics circuit 303. Typically, a subsystem circuit 302 interfaces with thirty-two drive electronics circuits 303. The subsystem circuit 302 also functions to collect environmental sense information for transmission to control unit 101 via command and status circuit 301. Thus, the control and drive circuits 121 in disk drive manager 102-1 perform the data and control signal interface and transmission function between the commodity disk drives of disk drive subset 103-1 and control unit 101.

The control unit 101 determines whether an individual disk drive in the redundancy group it is addressing has malfunctioned. The control unit 101 that has detected a bad disk drive transmits a control message to disk drive manager 102-1 over the corresponding control signal lead to indicate that a disk drive has failed. When the need for a spare disk drive is detected by the control unit 101, the faulty disk drive is taken out of service and a spare disk drive 125-1 is activated from the spare pool of r disk drives (125-1 to 125-r) by the disk drive manager 102-1, at the request of control unit 101. This is accomplished by rewriting the configuration definition of that redundancy group that contained the bad disk drive. The new selected disk drive 125-1 in the redundancy group (122-1 to 122-n+m) is identified by control signals which are transmitted to all of cluster control 111-112. This insures that the system mapping information stored in each of cluster controls 111-112 is kept up to date.

Once the new disk drive (125-1) is added to the redundancy group (122-1 to 122-n+m), it is tested and, if found to be operating properly, it replaces the failed disk drive in the system mapping tables. The control unit 101 that requested the spare disk drive (125-1) reconstructs the data for the new disk drive (125-1) using the remaining n−1 operational data disk drives and the m available redundancy information from the m redundancy disk drives. Before reconstruction is complete on the disk, data is still available to the host processors 11, 12, although it must be reconstructed on line rather than just reading it from a single disk. When this data reconstruction operation is complete, the reconstructed segments are written on the replacement disk drive (125-1) and the redundancy group is again fully operational.

This dynamically reconfigurable attribute of the data storage subsystem 100 enables this system to be very robust. In addition, the dynamically configurable aspect of the communication path between the cluster controls 111, 112 and the disk drives (122-1) permits the architecture to be very flexible. With the same physical disk drive subset (103-1), the user can implement a disk drive memory that has a high data storage capacity and which requires shorter periodic repair intervals, or a disk drive memory that has a lower data storage capacity with longer required repair intervals simply by changing the number of active disk drives in each redundancy group. In addition, the disk drive memory has the ability to detect new spare disk drives 123 when they are plugged in to the system thereby enabling the disk drive memory to grow as the storage or reliability needs change without having to reprogram the disk drive memory control software.

With respect to data transfer operations, all data transfers go through cache memory 113. Therefore, front end or channel transfer operations are completely independent of backend or device transfer operations. In this system, staging operations are similar to staging in other cached disk subsystems but destaging transfers are collected into groups for bulk transfers. In addition, this data storage subsystem 100 simultaneously performs free space collection, mapping table backup, and error recovery as background processes. Because of the complete front end/backend separation, the data storage subsystem 100 is liberated from the exacting processor timing dependencies of previous count key data disk subsystems. The subsystem is free to dedicate its processing resources to increasing performance through more intelligent scheduling and data transfer control.

The disk drive array data storage subsystem 100 consists of three abstract layers: virtual, logical and physical. The virtual layer functions as a conventional large form factor disk drive memory. The logical layer functions as an array of storage units that are grouped into a plurality of redundancy groups (ex 122-1 to 122-n+m), each containing n+m disk drives to store n physical tracks of data and m physical tracks of redundancy information for each logical track. The physical layer functions as a plurality of individual small form factor disk drives. The data storage management system operates to effectuate the mapping of data among these abstract layers and to control the allocation and management of the actual space on the physical devices. These data storage management functions are performed in a manner that renders the operation of the disk drive array data storage subsystem 100 transparent to the host processors (11-12).

A redundancy group consists of n+m disk drives. The redundancy group is also called a logical volume or a logical device. Within each logical device there are a plurality of logical tracks, each of which is the set of all physical tracks in the redundancy group which have the same physical track address. These logical tracks are also organized into logical cylinders, each of which is the collection of all logical tracks within a redundancy group which can be accessed at a common logical actuator position. A disk drive array data storage subsystem 100 appears to the host processor to be a collection of large form factor disk drives, each of which contains a predetermined number of tracks of a predetermined size called a virtual track. Therefore, when the host processor 11 transmits data over the data channel 21 to the data storage subsystem 100, the data is transmitted in the form of the individual records of a virtual track. In order to render the operation of the disk drive array data storage subsystem 100 transparent to the host processor 11, the received data is stored on the actual physical disk drives (122-1 to 122-n+m) in the form of virtual track instances which reflect the capacity of a track on the large form factor disk drive that is emulated by data storage subsystem 100. Although a virtual track instance may spill over from one physical track to the next physical track, a virtual track instance is not permitted to spill over from one logical cylinder to another. This is done in order to simplify the management of the memory space.

When a virtual track is modified by the host processor 11, the updated instance of the virtual track is not rewritten in data storage subsystem 100 at its original location but is instead written to a new logical cylinder and the previous instance of the virtual track is marked obsolete. Therefore, over time a logical cylinder becomes riddled with "holes" of obsolete data known as free space. In order to create whole free logical cylinders, virtual track instances that are still valid and located among fragmented free space within a logical cylinder are relocated within the disk drive array data storage subsystem 100 in order to create entirely free logical cylinders. In order to evenly distribute data transfer activity, the tracks of each virtual device are selected as uniformly as possible among the logical devices in the disk drive array data storage subsystem 100. In addition, virtual track instances are padded out if necessary to fit into an integral number of physical device sectors. This is to insure that each virtual track instance starts on a sector boundary of the physical device.

It is necessary to accurately record the location of all data within the disk drive array data storage subsystem 100 since the data received from the host processors 11-12 is mapped from its address in the virtual space to a physical location in the subsystem in a dynamic fashion. A virtual track directory is maintained to recall the location of the current instance of each virtual track in the disk drive array data storage subsystem 100. The virtual track directory consists of an entry for each virtual track which the associated host processor 11 can address. The entry contains the logical sector address at which the virtual track instance begins. The virtual track directory entry also contains data indicative of the length of the virtual track instance in sectors. The virtual track directory is stored in noncontiguous pieces of the cache memory 113 and is addressed indirectly through pointers in a virtual device table. The virtual track directory is updated whenever a new virtual track instance is written to the disk drives.

The storage control also includes a free space directory (FIG. 8) which is a list of all of the logical cylinders in the disk drive array data storage subsystem 100 ordered by logical device. Each logical device is cataloged in a list called a free space list for the logical device; each list entry represents a logical cylinder and indicates the amount of free space that this logical cylinder presently contains. This free space directory contains a positional entry for each logical cylinder; each entry includes both forward and backward pointers for the doubly linked free space list for its logical device and the number of free sectors contained in the logical cylinder. Each of these pointers points either to another entry in the free space list for its logical device or is null. The collection of free space is a background process that is implemented in the disk drive array data storage subsystem 100. The free space collection process makes use of the logical cylinder directory which is a list contained in the first sector of each logical cylinder indicative of the contents of that logical cylinder. The logical cylinder directory contains an entry for each virtual track instance contained within the logical cylinder. The entry for each virtual track instance contains the identifier of the virtual track instance and the identifier of the relative sector within the logical cylinder in which the virtual track instance begins. From this directory and the virtual track directory, the free space collection process can determine which virtual track instances are still current in this logical cylinder and therefore need to be moved to another location to make the logical cylinder available for writing new data.

Figure 6:
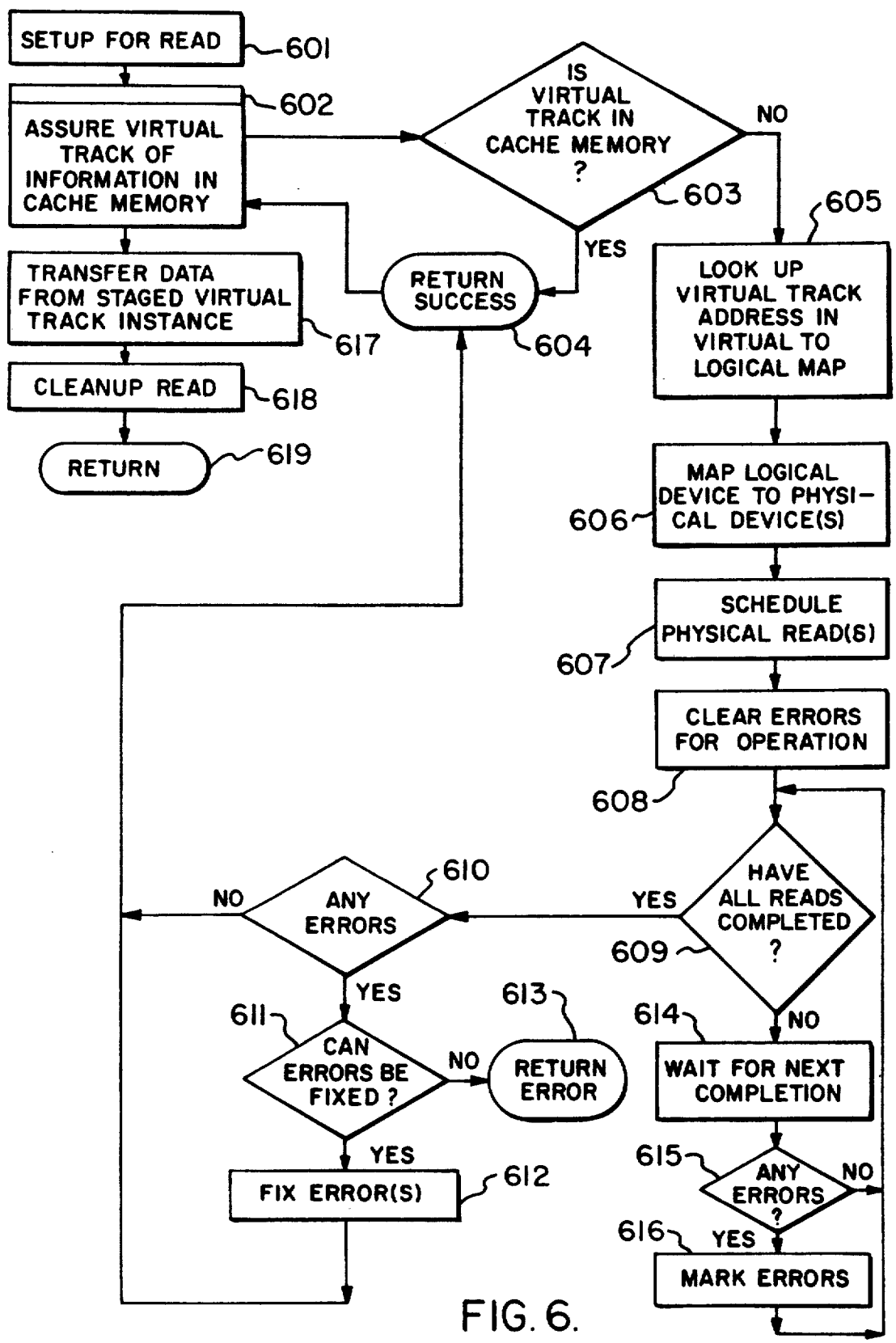
FIGS. 6 and 7 illustrate, in flow diagram form, the operational steps taken to perform a data read and write operation, respectively.

FIG. 6 illustrates in flow diagram form the operational steps taken by processor 204 in control unit 101 of the data storage subsystem 100 to read data from a data redundancy group 122-1 to 122-n+m in the disk drive subsets 103. The disk drive array data storage subsystem 100 supports reads of any size. However, the logical layer only supports reads of virtual track instances. In order to perform a read operation, the virtual track instance that contains the data to be read is staged from the logical layer into the cache memory 113. The data record is then transferred from the cache memory 113 and any clean up is performed to complete the read operation.

At step 601, the control unit 101 prepares to read a record from a virtual track. At step 602, the control unit 101 branches to the cache directory search subroutine to assure that the virtual track is located in the cache memory 113 since the virtual track may already have been staged into the cache memory 113 and stored therein in addition to having a copy stored on the plurality of disk drives (122-1 to 122-n+m) that constitute the redundancy group in which the virtual track is stored. At step 603, the control unit 101 scans the hash table directory of the cache memory 113 to determine whether the requested virtual track is located in the cache memory 113. If it is, at step 604 control returns back to the main read operation routine and the cache staging subroutine that constitutes steps 605-616 is terminated.

Assume, for the purpose of this description, that the virtual track that has been requested is not located in the cache memory 113. Processing proceeds to step 605 where the control unit 101 looks up the address of the virtual track in the virtual to logical map table. At step 606, the logical map location is used to map the logical device to one or more physical devices in the redundancy group. At step 607, the control unit 101 schedules one or more physical read operations to retrieve the virtual track instance from appropriate ones of identified physical devices 122-1 to 122-n+m. At step 608, the control unit 101 clears errors for these operations. At step 609, a determination is made whether all the reads have been completed, since the requested virtual track instance may be stored on more than one of the N+M disk drives in a redundancy group. If all of the reads have not been completed, processing proceeds to step 614 where the control unit 101 waits for the next completion of a read operation by one of the N+M disk drives in the redundancy group. At step 615 the next reading disk drive has completed its operation and a determination is made whether there are any errors in the read operation that has just been completed. If there are errors, at step 616 the errors are marked and control proceeds back to the beginning of step 609 where a determination is made whether all the reads have been completed. If at this point all the reads have been completed and all portions of the virtual track instance have been retrieved from the redundancy group, then processing proceeds to step 610 where a determination is made whether there are any errors in the reads that have been completed. If errors are detected then at step 611 a determination is made whether the errors can be fixed. One error correction method is the use of a Reed-Solomon error detection/correction code to recreate the data that cannot be read directly. If the errors cannot be repaired then a flag is set to indicate to the control unit 101 that the virtual track instance can not be read accurately. If the errors can be fixed, then in step 612 the identified errors are corrected and processing returns back to the main routine at step 604 where a successful read of the virtual track instance from the redundancy group to the cache memory 113 has been completed.

At step 617, control unit 101 transfers the requested data record from the staged virtual track instance in which it is presently stored. Once the records of interest from the staged virtual track have been transferred to the host processor 11 that requested this information, then at step 618 the control unit 101 cleans up the read operation by performing the administrative tasks necessary to place all of the apparatus required to stage the virtual track instance from the redundancy group to the cache memory 113 into an idle state and control returns at step 619 to service the next operation that is requested.

Figure 7:
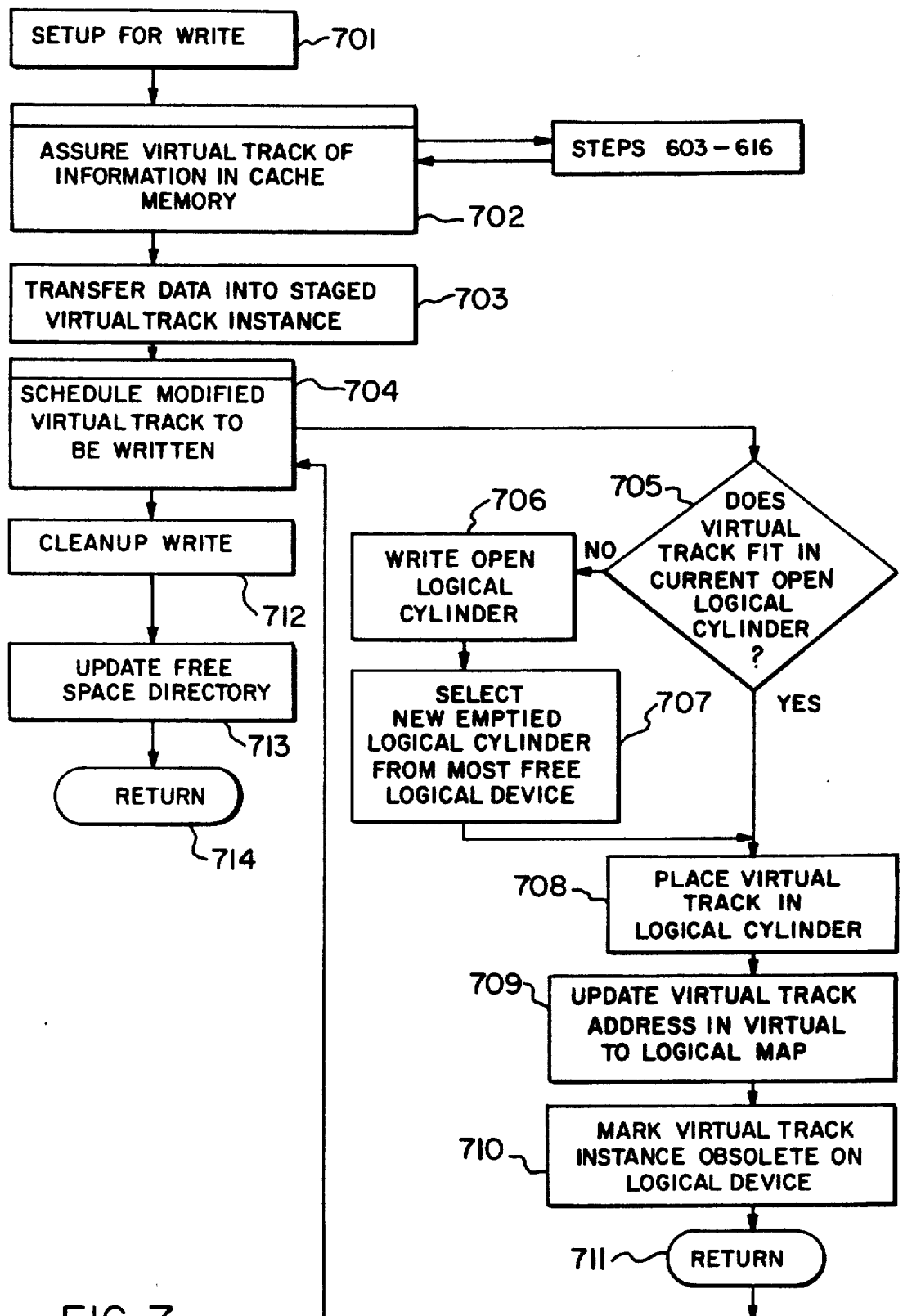

FIG. 7 illustrates in flow diagram form the operational steps taken by the disk drive array data storage subsystem 100 to perform a data write operation. The disk drive array data storage subsystem 100 supports writes of any size, but again, the logical layer only supports writes of virtual track instances. Therefore in order to perform a write operation, the virtual track that contains the data record to be rewritten is staged from the logical layer into the cache memory 113. Once the write operation is complete, the location of the obsolete instance of the virtual track is marked as free space. The modified data record is then transferred into the virtual track and this updated virtual track instance is then scheduled to be written from the cache memory 113 where the data record modification has taken place into the logical layer. Any clean up of the write operation is then performed once this transfer and write is completed.

At step 701, the control unit 101 performs the set up for a write operation and at step 702, as with the read operation described above, the control unit 101 branches to the cache directory search subroutine to assure that the virtual track into which the data is to be transferred is located in the cache memory 113. Since all of the data updating is performed in the cache memory 113, the virtual track in which this data is to be written must be transferred from the redundancy group in which it is stored to the cache memory 113 if it is not already resident in the cache memory 113. The transfer of the requested virtual track instance to the cache memory 113 is performed for a write operation as it is described above with respect to a data read operation and constitutes steps 603-616 illustrated in FIG. 6 above.

At step 703, the control unit 101 marks the virtual track instance that is stored in the redundancy group as invalid in order to assure that the logical location at which this virtual track instance is stored is not accessed in response to another host processor 12 attempting to read or write the same virtual track. Since the modified record data is to be written into this virtual track in the cache memory 113, the copy of the virtual track that resides in the redundancy group is now inaccurate and must be removed from access by the host processors 11-12. At step 704, the control unit 101 transfers the modified record data received from host processor 11 into the virtual track that has been retrieved from the redundancy group into the cache memory 113 to thereby merge this modified record data into the original virtual track instance that was retrieved from the redundancy group. Once this merge has been completed and the virtual track now is updated with the modified record data received from host processor 11, the control unit 101 must schedule this updated virtual track instance to be written onto a redundancy group somewhere in the disk drive array data storage subsystem 100.

This scheduling is accomplished by the subroutine that consists of steps 706-711. At step 706, the control unit 101 determines whether the virtual track instance as updated fits into an available open logical cylinder. If it does not fit into an available open logical cylinder, then at step 707 then this presently open logical cylinder must be closed out and written to the physical layer and another logical cylinder selected from the most free logical device or redundancy group in the disk drive array data storage subsystem 100. At step 708, the selection of a free logical cylinder from the most free logical device takes place. This ensures that the data files received from host processor 11 are distributed across the plurality of redundancy groups in the disk drive array data storage subsystem 100 in an even manner to avoid overloading certain redundancy groups while underloading other redundancy groups. Once a free logical cylinder is available, either being the presently open logical cylinder or a newly selected logical cylinder, then at step 709, the control unit 101 writes the updated virtual track instance into the logical cylinder and at step 710 the new location of the virtual track is placed in the virtual to logical map in order to render it available to the host processors 11-12. At step 711, control returns to the main routine, where at step 712 the control unit 101 cleans up the remaining administrative tasks to complete the write operation and return to an available state at 712 for further read or write operations from host processor 11.

The data file move/copy operation instantaneously relocates or creates a second instance of a selected data file by merely generating a new set of pointers to reference the same physical memory location as the original set of reference pointers in the virtual track directory. In this fashion, by simply generating a new set of pointers referencing the same physical memory space, the data file can be moved/copied.

This apparatus instantaneously moves the original data file without the time penalty of having to download the data file to the cache memory 113 and write the data file to a new physical memory location. For the purpose of enabling a program to simply access the data file at a different virtual address the use of this mechanism provides a significant time advantage. A physical copy of the original data record can later be written as a background process to a second memory location, if so desired. Alternatively, when one of the programs that can access the data file writes data to or modifies the data file in any way, the modified copy of a portion of the original data file is written to a new physical memory location and the corresponding address pointers are changed to reflect the new location of this rewritten portion of the data file. In this fashion, a data file can be instantaneously moved/copied by simply creating a new set of memory pointers and the actual physical copying of the data file can take place either as a background process or incrementally as necessary when each virtual track of the data file is modified by one of the programs that accesses the data file.

Each entry in the Virtual Track Directory (VTD) contains two flags associated with the Copy/Move function. The "Source" flag is set whenever a Virtual Track Instance at this Virtual Track Address has been the origin of a copy or move. The Virtual Track Instance pointed to by this entry is not necessarily the Source, but the Virtual Track Instance contains this Virtual Address. If the Source flag is set, there is at least one entry in the Copy Table for this Virtual Address. The "Target" flag is set whenever a Virtual Track Instance contains data that has been the destination of a copy or move. If the Target flag is set, the Virtual Address in the Virtual Track Instance that is pointed to is not that of the VTD Entry.

The format of the Copy Table is illustrated here graphically. The preferred implementation is to have a separate Copy Table for each Logical Device so that there is a Copy Table head and tail pointer associated with each Logical Device; however, the table could just as easily be implemented as a single table for the entire subsystem. The table is ordered such that the sources are in ascending Logical Address order.

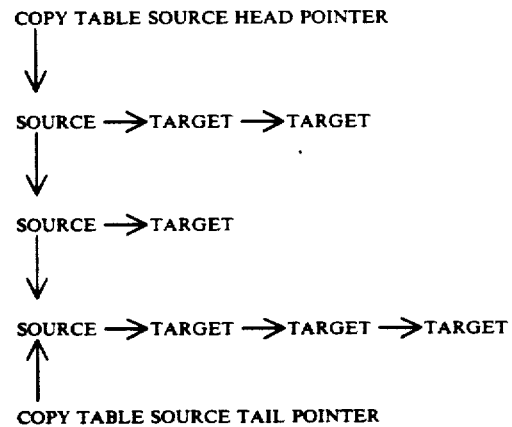

Figure 8:
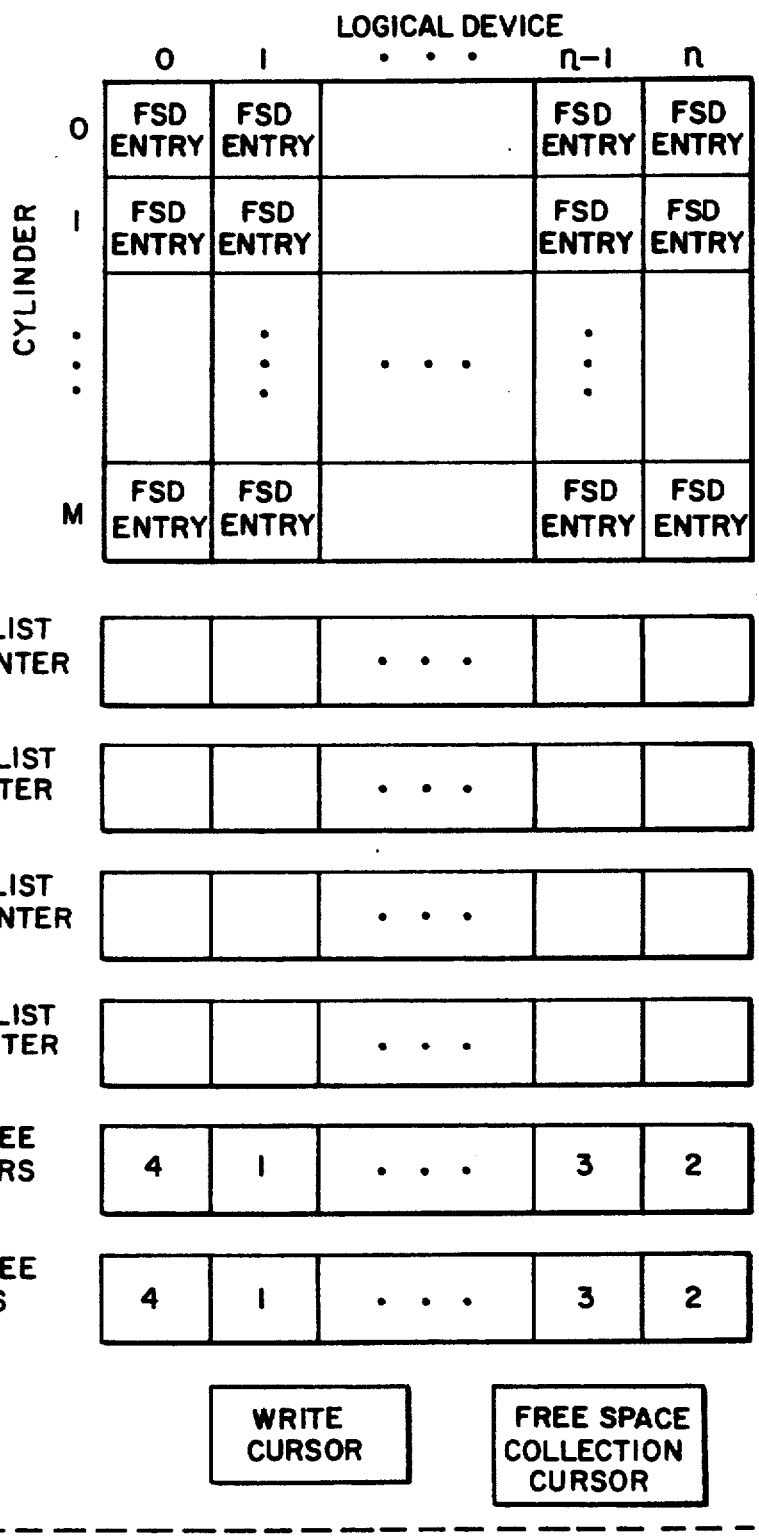
FIG. 8 illustrates a typical free space directory used in the data storage subsystem.

The table is a singly linked list of Sources where each Source is the head of a linked list of Targets. The Source Entry contains the following:
Logical Address (VTD Entry Copy)
Virtual Address
Next Source Pointer (NULL if last Source in list)
Target Pointer
The Target Entry contains the following:
Virtual Address
Next Target Pointer (NULL if last Target in list)
Update Count Fields Flag When data in Cache memory 113 is modified, it cannot be written back to its previous location on a disk drive in disk drive subsets 103 since that would invalidate the redundancy information on that logical track for the redundancy group. Therefore, once a virtual track has been updated, that track must be written to a new location in the data storage subsystem 100 and the data in the previous location must be marked as free space. Therefore, in each redundancy group, the logical cylinders become riddled with "holes" of obsolete data in the form of virtual track instances that are marked as obsolete. In order to completely empty logical cylinders for destaging, the valid data in partially valid cylinders must be read into cache memory 113 and rewritten into new previously emptied logical cylinders. This process is called free space collection. The free space collection function is accomplished by control unit 101. Control unit 101 selects a logical cylinder that needs to be collected as a function of how much free space it contains. The free space determination is based on the free space directory as illustrated in FIG. 8, which indicates the availability of unused memory in data storage subsystem 100. The table illustrated in FIG. 8 is a listing of all of the logical devices contained in data storage subsystem 100 and the identification of each of the logical cylinders contained therein. The entries in this chart represent the number of free physical sectors in this particular logical cylinder. A write cursor is maintained in memory and this write cursor indicates the available open logical cylinder that control unit 101 will write to when data is destaged from cache 113 after modification by associated host processor 11-12 or as part of a free space collection process. In addition, a free space collection cursor is maintained which points to the present logical cylinder that is being cleared as part of a free space collection process. Therefore, control unit 101 can review the free space directory illustrated in FIG. 8 as a backend process to determine which logical cylinder on a logical device would most benefit from free space collection. Control unit 101 activates the free space collection process by reading all of the valid data from the selected logical cylinder into cache memory 113. The logical cylinder is then listed as completely empty, since all of the virtual track instances therein are tagged as obsolete. Additional logical cylinders are collected for free space collection purposes or as data is received from an associated host processor 11-12 until a complete logical cylinder has been filled. Once a complete logical cylinder has been filled, a new previously emptied logical cylinder is chosen.

Figure 9:
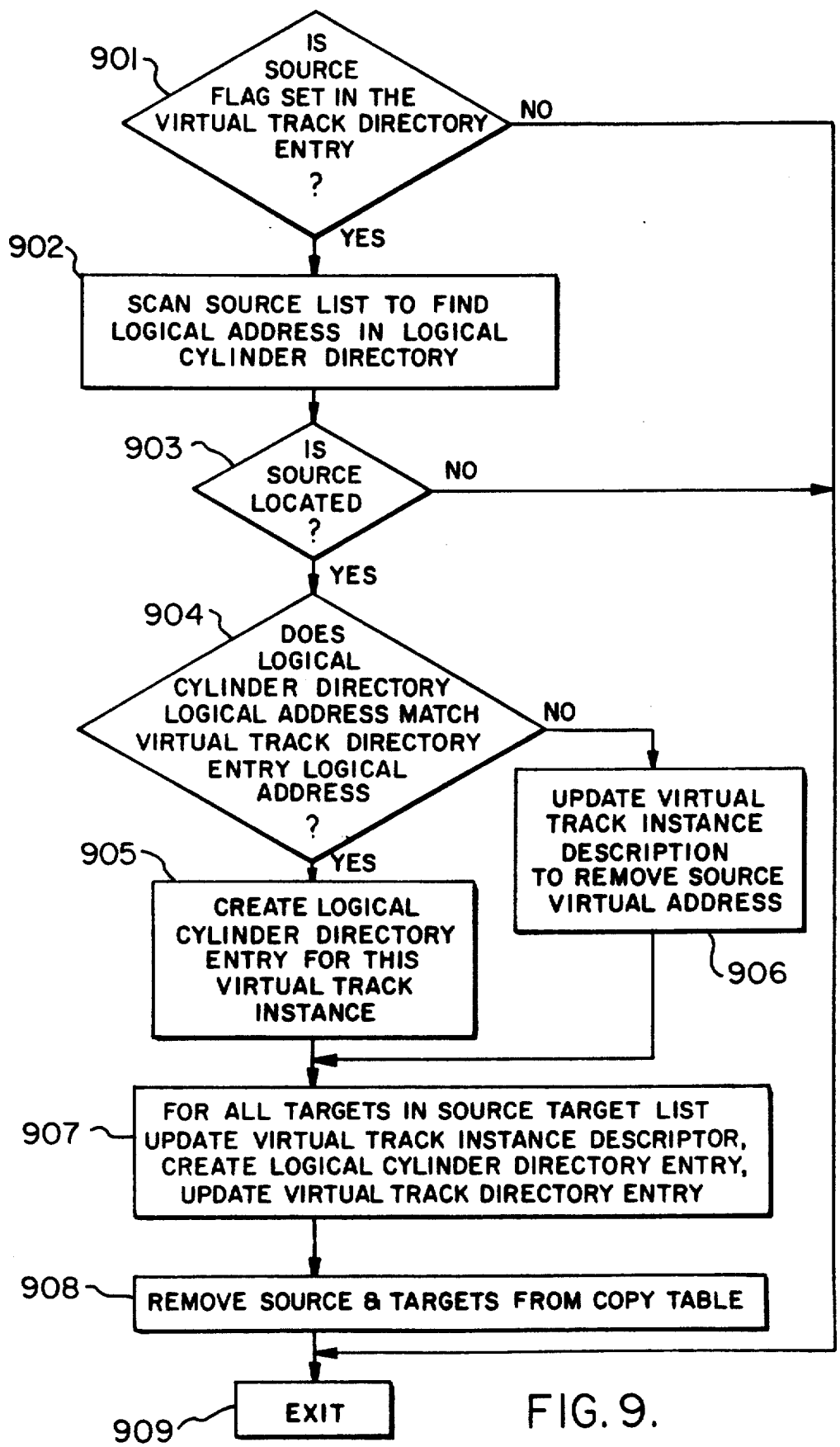
FIG. 9 illustrates, in flow diagram form, the free space collection process.

FIG. 9 illustrates in flow diagram form the operational steps taken by processor 204 to implement the free space collection process. The use of Source and Target Flags is necessitated by the free space collection process since this process must determine whether each virtual track instance contains valid or obsolete data. In addition, the free space collection process performs the move/copy count field adjustment operations listed in the copy table. The basic process is initiated at step 901 when processor 204 selects a logical cylinder for collection based on the number of free logical sectors as listed in the table of FIG. 8. Processor 204 checks each virtual track directory entry to determine if the Source Flag is set. If not, the process exits at step 909 to the next logical track. If the Source Flag is set, at step 902 processor 204 scans the source list to find the logical address in the logical cylinder directory. If no address is found, this virtual track instance is an obsolete version and is no longer needed (invalid). This data is not relocated.

If the address is found, at step 904, processor 204 compares the logical cylinder directory logical address with the virtual track directory entry logical address. If there is a match, processor 204 creates a logical cylinder directory entry for this virtual track instance. If there is not a match, the Source has been updated and exists elsewhere. Processor 204 at step 906 updates the virtual track instance descriptor to remove the source virtual address. Upon completion of either step 905 or 906, processor 204 at step 907 for all Targets in this Source's Target List updates the virtual track instance descriptor to include this virtual address and the update count fields flag from the Copy Table. In addition, processor 204 creates a logical cylinder directory entry for this virtual track instance. Finally, processor 204 updates the virtual track directory entry for the Target to point to the new location and to clear the Target Flag. Processor 204 at step 908 removes this Source and all its Targets from the Copy Table. Processor 204 also scans the Copy Table for Sources with the same virtual address and clears the Source Flag. The changes are then journaled to the virtual track directory and to the Copy Table.

Figure 4:
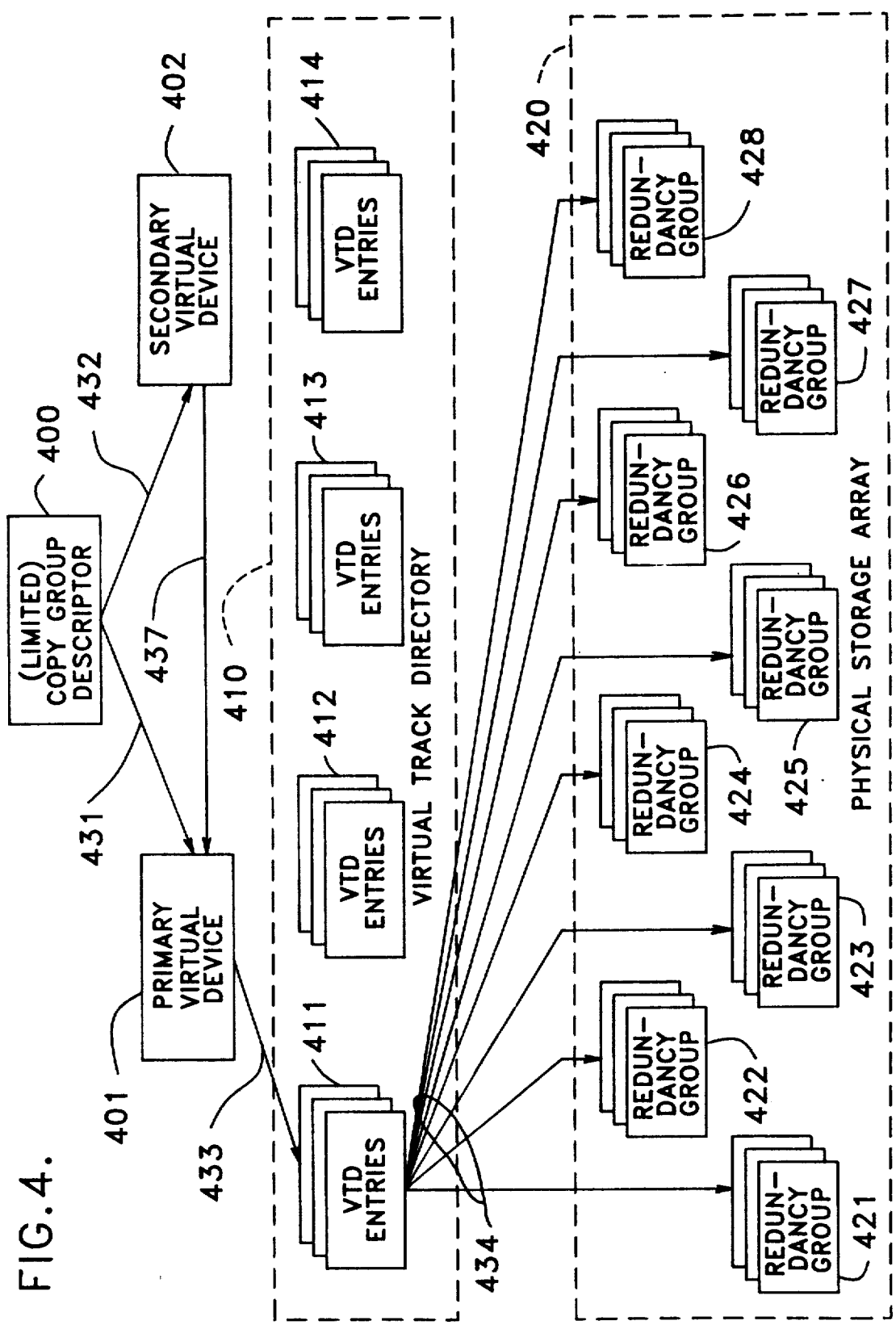
FIG. 4 illustrates the data record mapping for the phantom duplex copy group operation.
Figure 5:
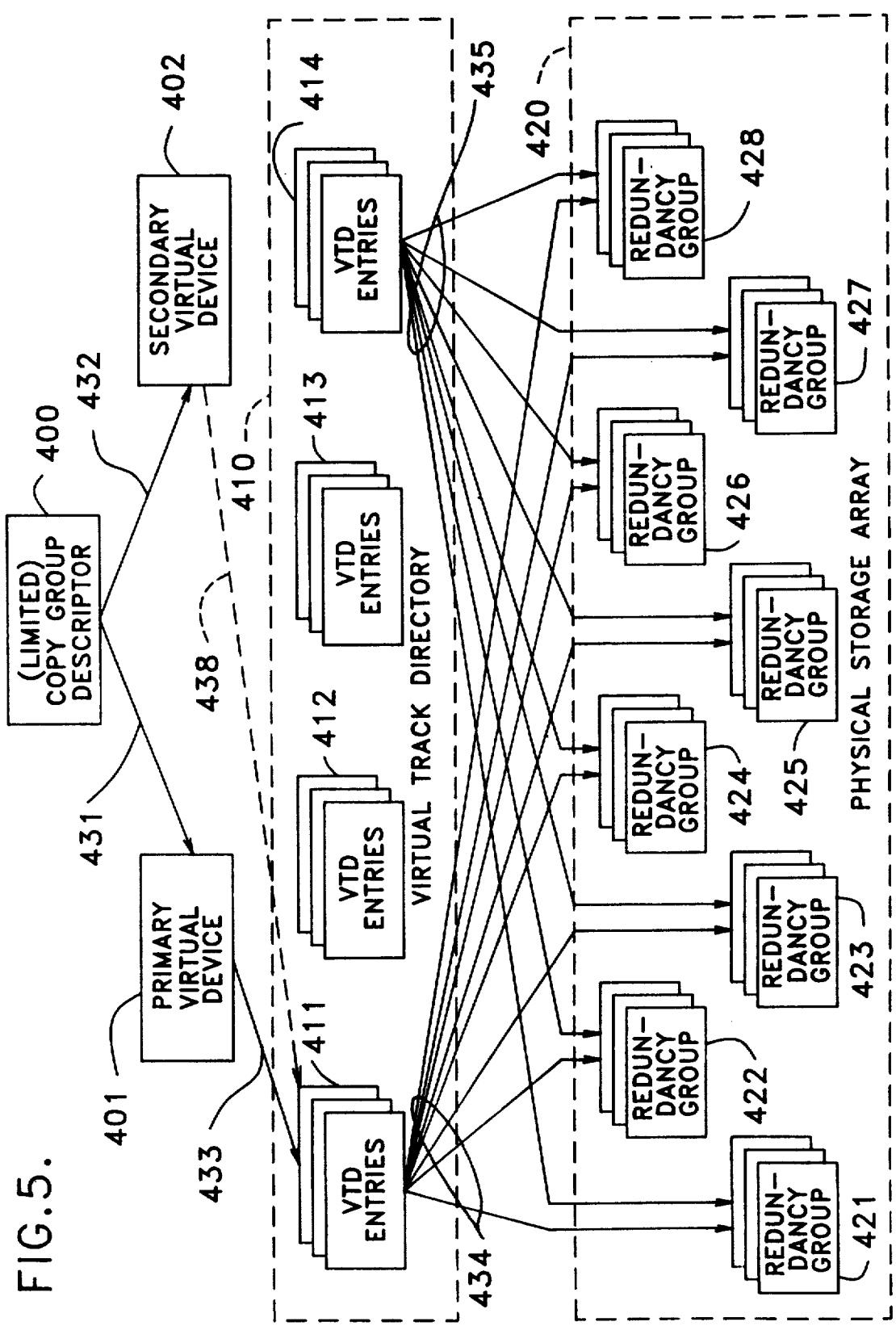
FIG. 5 illustrates the data record mapping for the suspended phantom duplex copy group operation.

FIGS. 4 and 5 illustrate in block diagram form the data structures used to provide duplex copy group capability, while FIG. 10 illustrates in flow diagram form the operational steps taken by the data storage subsystem to provide the duplex copy group capability. In addition to transmitting data records to the data storage subsystem 100 for storage therein, the host processor transmits channel commands which are instructions to the data storage subsystem 100 to control the address at which the data records are stored and to designate the mode of operation of data storage subsystem 100. These channel commands are well known in the art and are not disclosed in any detail herein.

One capability presently found in data storage subsystems, such as IBM's 3990 Storage Control Unit (as described in the IBM publication titled "IBM 3990 Storage Control Reference" reference no. GA32-0099-3), is the duplex copy group capability. As noted above, in order to improve the reliability of data storage on the disk drives, the host processor can designate two disk drives connected to a single control unit as a duplex pair, wherein a data record stored on a primary disk drive in the duplex pair is also concurrently stored by the storage control unit on the secondary disk drive of the duplex pair. In this manner, duplicate copies are kept of each data record stored in the data storage subsystem.

The host processor 11 activates this feature by transmitting channel commands to the storage control unit 101 designating the primary and secondary disk drives to be used in a duplex pair configuration. This process is initiated at step 1001 on FIG. 10, wherein the host processor 11 transmits a "create duplex copy group" channel command to data storage subsystem 100, which channel command designates the primary and secondary disk drives. Data storage subsystem 100 is a dynamically mapped virtual device data storage system. Therefore, the disk drive devices designated by the host processor 11 do not in reality exist in the form that is understood by the host processor 11. In particular, the data storage subsystem 100 makes use of a plurality of small disk drives interconnected into redundancy groups to emulate the operation of large form factor disk drives. The host processor 11, in designating a primary storage device, designates what appears to be a large form factor disk drive but which is reality consists of portions of at least one redundancy group in the disk drive array 103 of the data storage subsystem 100. As noted above, this emulation is accomplished through the use of mapping tables which map the virtual image of the emulated device to physical storage locations on the small form factor disk drives in the redundancy group.

This is illustrated schematically in FIG. 4 wherein host processor 11 defines at step 1002 (FIG. 10) a duplex copy group which includes primary and secondary data storage devices. Control unit 101 responds to this command by creating a copy group descriptor 400 entry in cache memory 113 which contains pointers 431, 432 that designate the virtual devices 401 and 402 as defined in the Virtual Device Table entries in control unit 101 of the data storage subsystem 100. The mapping in control unit 101 is performed by an available processor 204 in one of storage paths 200 in one of cluster controls 111, 112. The mapping tables are stored in shared memory in cache 113 and are available to all processors 204 in control unit 101. This virtual device 401 defined by the Virtual Device Table entry in control unit 101 maps to a set of Virtual Track Directory entries 411 in the virtual track directory 410 that is maintained by control unit 101 in cache memory 113. These Virtual Track Directory entries 411 contain data indicative of the mapping of the virtual track as defined by control unit 101, to the Virtual Track Instances, which are the actual physical storage locations in the redundancy groups 421-428 which contain the data records for that defined virtual track. The mapping information therefore represents pointers 434 which point to the physical storage locations 421-428. In response to the host processor 11 designating a primary data storage device, control unit 101 of the data storage subsystem 100 assigns the primary virtual data storage device 401 and a plurality of virtual track directory entries 411 associated with this virtual data storage device 401. The host processor 11 also designates a secondary data storage device which is paired with the primary data storage device for storing the backup or duplicate copies of the data records stored in the primary data storage device. The disk drive array architecture of data storage subsystem 100 obviates the need for maintaining a second physical copy of the data record that is stored in the primary virtual data storage device 401. However, in order to be responsive to the commands transmitted by host processor 11, the control unit 101 of data storage subsystem 100 at step 1003 emulates the secondary data storage device 402 by assigning a secondary virtual data storage device which simply consists of data indicative of the location of the primary virtual storage device 401. The primary virtual data storage device 401 is itself simply a pointer to a set of entries 411 in a mapping table and the secondary virtual data storage device 402 is therefore a simple pointer 437 pointing to this table of data entries 411 via the primary virtual data storage device 401. There is no physical storage associated with the secondary virtual data storage device 402 and therefore no virtual track directory entries are assigned to the secondary virtual data storage device 402. The secondary virtual data storage device 402 shares the realization of primary virtual data storage device 401 by referencing the Virtual Track Directory entries 411 and the Virtual Track instances to which they point. Using this architecture, the host processor 11 can access either the primary 401 or the secondary 402 virtual data storage device in the conventional manner since access to the secondary virtual data storage device 402 is processed by data storage subsystem 100 by simply redirecting the request to the primary virtual data storage device 401 as defined by the control unit 101.

This architecture has significant advantages over the conventional duplex copy group operation since, in the prior art, data records written to one data storage device of the duplex pair requires a second data write operation to the associated other storage device of the duplex pair. The necessity to write two copies of the data record on disk drives represents a processing burden on the typical storage control unit since it takes twice as much time for the storage control unit to write the dual copies as opposed to writing a single copy into the disk drives. The control unit 101 of the present apparatus simply writes one copy of the data record in the redundancy groups designated by the virtual track directory entry 411 for this virtual data storage device. No additional overhead is required to provide the duplex copy group operation since there is a single shared realization of the two virtual data storage devices 401, 402.

Alternatively, the correspondence between the received data records and the identity of the disk drives in the selected redundancy group on which they are stored can be accomplished by maintaining two Virtual Track Directory entries 411, 414 in the virtual track directory 410, each of which contains identical data indicative of the mapping of the virtual track, as defined by control unit 101, to the Virtual Track Instances in redundancy groups 421-428. This is illustrated schematically in FIG. 5 by the set of pointers 434, 435 associated with each of the virtual track directory entries 411, 414 indicative of two identical copies of the data records. This configuration also conserves physical space in the redundancy groups but requires additional Virtual Track Directory entries in comparison to the implementation previously discussed.

The host processor 11 can suspend the duplex copy group operation and require that the two disk drives operate independent of each other. The host processor 11 terminates the duplex copy group operation by transmitting a "suspend duplex copy group" channel command to data storage subsystem 100 at step 1004. Since there is only one physical copy of the data records in data storage subsystem 100 and only one set of pointers that map the primary and secondary virtual data storage devices to the shared set of physical data storage locations, the data storage subsystem 100 must create a second realization of the shared virtual data storage device since the host processor 11 can write data to either of these data storage devices independent of the other. In order to accomplish this, the storage control unit 101 simply replicates at step 1005 the virtual track directory entries 411 associated with the primary virtual data storage device 401 and assigns these new virtual track directory entries 414 to the secondary virtual data storage device 402 that was assigned by the control unit 101. This step of replication can also be implemented via the copy operation described above wherein a pointer 438 to the primary virtual track directory entries 411 from secondary virtual data storage device 402 is used to instantaneously copy the directory entries 411.

FIG. 5 illustrates schematically the result of the first noted copy operation. Each virtual data storage device 401, 402 is defined and represents a large form factor disk drive to the host processor 11. Each virtual data storage device 401, 402 has a set of virtual track directory entries 411, 414 associated therewith, which entries map the virtual track of an emulated large form factor disk drive to the actual physical storage locations in the redundancy groups 421-428 wherein the data records for that track are stored. At the moment the host processor 11 suspends duplex copy group operation, the data records stored in the primary virtual data storage device 401 are identical to the data records stored in the secondary virtual data storage device 402 since the virtual track directory entries 411, 414 associated with both of these devices are identical, the pointers contained therein are identical and point to the same physical data records stored in the redundancy groups 421-428. Therefore, even though a second set of Virtual Track Directory entries 414 are created, there is still a partial shared realization of the primary virtual data storage device since the Virtual Track Instances on the disk drives 421-428 in the redundancy group are shared by both primary 401 and secondary 402 virtual data storage devices.

This is illustrated schematically in FIG. 5 by the set of pointers 434, 435 associated with each of the virtual track directory entries 411, 414 indicative of the two identical copies of the data records. As the host processor 11 writes data to one or the other of these virtual data storage devices, the corresponding virtual track directory entries 411, 414 are updated. Since, as noted above, data records are never updated in place, any changes made thereto does not modify the original data record stored in the redundancy group 421-428 but instead creates a new data record which is stored in a new physical location either within the same redundancy group or in another redundancy group. Therefore, over time, the data storage subsystem 100 migrates toward two separate realizations of the two virtual data storage devices as the host processor 11 writes new data or updates data records stored in the virtual data storage devices 401, 402. The two devices increasingly contain different entries in the virtual track directories 411, 414 and point to different physical locations in the redundancy groups 421-428 where the data records are stored.

The host processor 11 can reinstate the duplex copy group operation by transmitting at step 1006 a "re-establish duplex copy group" channel command to the data storage subsystem 100 indicating which of the two data storage devices are to be saved and designated a primary data storage device. In response to the re-establish duplex copy group channel command received by the data storage subsystem 100 from the host processor 11, the data storage subsystem 100 at step 1007 simply erases the virtual track directory entries 414 associated with the virtual data storage device 402 that the host processor 11 has indicated should be deleted. The remaining virtual data storage device 401 is now the primary data storage device and a secondary virtual data storage device is implemented (FIG. 4) as noted above by simply linking the Virtual Device Table entry 402 in control unit 101 with pointer 437 to the primary virtual data storage device 401. Therefore, the data storage subsystem 100 can re-establish a duplex copy group operation in a fraction of the time typically required of a data storage system since this operation represents the manipulation of a few pointers as opposed to the complete replication of all of the data records stored on the primary data storage device into a secondary data storage device defined by the host processor.

The host processor 11 can terminate the duplex copy group operation and require that the two disk drives operate independent of each other. The host processor 11 terminates the duplex copy group operation by transmitting a "terminate duplex copy group" channel command to data storage subsystem 100 at step 1008. If the duplex copy group is in a suspended state, as a result of the actions of data storage subsystem 100 at step 1005, the suspension is made permanent by data storage subsystem 100 at step 1009. Otherwise, data storage subsystem 100 permanently suspends the duplex copy group as in step 1005.

While a specific embodiment of this invention has been disclosed herein, it is expected that those skilled in the art can design other embodiments that differ from this particular embodiment but fall within the scope of the appended claims.

We claim:

1. A disk memory system for storing data records, which are transmitted to said disk memory system by at least one associated host processor, on one of a plurality of virtual data storage devices located in said disk memory system and identified by said host processor, comprising:
   a plurality of disk drives, a subset of said plurality of disk drives being configured into at least two redundancy groups, each of which includes at least two disk drives;
   means, responsive to a receipt of a stream of data records, for selecting available memory space in one of said redundancy groups to store said received stream of data records thereon;
   means for writing said received stream of data records and redundancy data associated with said received stream of data records in said selected available memory space;
   means for maintaining data indicative of a correspondence between said received stream of data records and an identity of the disk drives in said selected redundancy group on which said received stream of data records is stored;
   means, responsive to said host processor requesting activation of duplex copy group capability for a designated primary virtual data storage device and a secondary virtual data storage device in said disk memory system, for emulating said secondary virtual data storage device, comprising:
      means for storing data indicative of an identity of said designated primary virtual data storage device, including said correspondence data which identifies said disk drives on which said received stream of data records is stored,
      means for storing data indicative of an identity of said designated secondary virtual data storage device, including data which identifies said disk drives on which said received stream of data records is stored in said designated primary virtual data storage device, and
      means, responsive to a query from said host processor to said designated secondary virtual data storage device, for accessing said disk drives of said designated primary virtual data storage device.

2. The system of claim 1 wherein said correspondence data comprises a set of pointers which identify said selected available memory space in said selected redundancy group, and said secondary virtual data storage device identity data comprises data indicative of said identity of said designated primary virtual data storage device, said emulating means further includes:
   means, responsive to said host processor transmitting a command to said disk memory system to discontinue duplex copy group operation, for creating a duplicate copy of said correspondence data,
   means for associating said copied correspondence data with said designated secondary virtual data storage device,
   means for deleting said stored data indicative of said identity of said designated primary virtual data storage device from said secondary virtual data storage device identity data, and
   means, responsive to a query from said host processor, for interpreting said duplicate copy of said correspondence data as said secondary virtual data storage device.

3. The system of claim 2 wherein said host processor transmits a command to said disk memory system to reestablish said discontinued duplex copy group by deleting one of said primary and secondary virtual data storage devices, said emulating means further includes:
   means for deleting said correspondence data for said designated deleted virtual data storage device.

4. The system of claim 1 wherein said correspondence data comprises a set of pointers which identify said selected available memory space in said selected redundancy group and said stored secondary virtual data storage device identity data comprises a copy of said correspondence data for said primary virtual data storage device, said emulating means further comprises:
   means, responsive to said host processor transmitting a command to said disk memory system to discontinue duplex copy group operation, for maintaining said primary and second virtual data storage device correspondence data independent of each other.

5. The system of claim 1 wherein said correspondence data comprises a set of pointers which identify said selected available memory space in said selected redundancy group, and said secondary virtual data storage device identity data comprises data indicative of said identity of said designated primary virtual data storage device, said emulating means further includes:
   means, responsive to said host processor transmitting a command to said disk memory system to suspend duplex copy group operation, for creating data indicative of an identity of said correspondence data for said designated primary virtual data storage device,
   means for associating said correspondence data identity data with said designated secondary virtual data storage device,
   means for deleting said stored data indicative of said identity of said designated primary virtual data storage device from said secondary virtual data storage device identity data, and
   means, responsive to a query from said host processor, for interpreting said correspondence data as said secondary virtual data storage device.

6. The system of claim 1 further including:
   means, responsive to a subsequent receipt of modifications to one of said data records stored in said designated primary virtual data storage device from said host processor, for writing said modified data record in one of said memory space in one of said redundancy groups;

means for converting said memory space used to store an originally received data record to available memory space; and wherein said maintaining means creates correspondence data indicative of a storage of said modified data record in said available memory space.

7. The system of claim 1 further comprising:

means for reserving at least one of said plurality of disk drives as backup disk drives, which backup disk drives are shared in common by said redundancy groups;

means for identifying one of said at least two disk drives in one of said redundancy groups that fails to function; and means for switchably connecting one of said backup disk drives in place of said identified failed disk drive.

8. The system of claim 7 further including:

means for reconstructing said stream of data records written on said identified failed disk drive, using said associated redundancy data; and means for writing said reconstructed stream of data records on to said one backup disk drive.

9. The system of claim 8 wherein said reconstructing means includes:

means for generating said stream of data records written on said identified failed disk drive using said associated redundancy data and data records written on remaining disk drives in said redundancy group.

10. A disk memory system for storing data records, which are transmitted to said disk memory system by at least one associated host processor, on one of a plurality of virtual data storage devices located in said disk memory system and identified by said host processor, comprising:

a plurality of disk drives for storing data thereon, a number of said disk drives being configured into at least two redundancy groups, each of said redundancy group including n+m of said plurality of disk drives and is configured into at least one virtual data storage device, where n and m are both positive integers with n greater than 1 and m equal to or greater than 1;

means for storing each stream of data records received from said associated host processor on successive ones of said n disk drives in a selected one of said redundancy groups;

means, responsive to said storing means storing streams of data records on all n disk drives in said selected redundancy group, for generating m segments of data redundancy information for said data records stored on said n disk drives;

means for writing said m segments of redundancy data on to said m disk drives of said selected redundancy group;

means for maintaining data indicative of a correspondence between each said received streams of data records and an identity of disk drives in said selected redundancy group on which each of said received stream of data records is stored;

means, responsive to said host processor requesting activation of duplex copy group capability for a designated primary virtual data storage device and a secondary virtual data storage device in said disk memory system, for emulating a secondary virtual data storage device, including:

means for storing data indicative of an identity of said designated primary virtual data storage device, including said correspondence data which identifies said disk drives on which said received stream of data records is stored, means for storing data indicative of an identity of said designated secondary virtual data storage device, including data which identifies said disk drives on which said received stream of data records is stored in said designated primary virtual data storage device, and means, responsive to a query from said host processor to said designated secondary virtual data storage device, for accessing said disk drives of said designated primary virtual data storage device.

11. The system of claim 10 wherein said correspondence data comprises a set of pointers which identify a selected available memory space in said selected redundancy group, and said secondary virtual data storage device identity data comprises data indicative of said identity of said designated primary virtual data storage device, said emulating means further includes:

means, responsive to said host processor transmitting a command to said disk memory system discontinue to suspend duplex copy group operation, for creating a duplicate copy of said correspondence data for said designated primary virtual data storage device, means for associating said copied correspondence data with said designated secondary virtual data storage device, means for deleting said stored data indicative of said identity of said designated primary virtual data storage device from said secondary virtual data storage device identity data, and means, responsive to a query from said host processor, for interpreting said duplicate copy of said correspondence data as said secondary virtual data storage device.

12. The system of claim 11 wherein said host processor transmits a command to said disk memory system to reestablish said discontinued duplex copy group by deleting one of said primary and secondary virtual data storage devices, said emulating means further includes:

means for deleting said correspondence data for said designated deleted virtual data storage device.

13. The system of claim 10 wherein said correspondence data comprises a set of pointers which identify said selected available memory space in said selected redundancy group and said stored secondary virtual data storage device identity data comprises a copy of said correspondence data for said primary virtual data storage device, said emulating means further comprises:

means, responsive to said host processor transmitting a command to said disk memory system to discontinue duplex copy group operation, for maintaining said primary and second virtual data storage device correspondence data independent of each other.

14. The system of claim 11 wherein said correspondence data comprises a set of pointers which identify said selected available memory space in said selected redundancy group, and said secondary virtual data storage device identity data comprises data indicative of an identity of said designated primary virtual data storage device, said emulating means further includes:

means, responsive to said host processor transmitting a command to said disk memory system to suspend duplex copy group operation, for creating data indicative of an identity of said correspondence data for said designated primary virtual data storage device, means for associating said correspondence data identity data with said designated secondary virtual data storage device, means for deleting said stored data indicative of said identity of said designated primary virtual data storage device from said secondary virtual data storage device identity data, and means, responsive to a query from said host processor, for interpreting said correspondence data as said secondary virtual data storage device.

15. The system of claim 10 further including:

means, responsive to a subsequent receipt of modifications to one of said data records stored in said designated primary virtual data storage device from said host processor, for writing said modified data record in one of said memory space in one of said redundancy groups;

means for converting said memory space used to store an originally received data record to available memory space; and wherein said maintaining means creates correspondence data indicative of storage of said modified data record in said available memory space.

16. The system of claim 10 further comprising:

means for reserving at least one of said plurality of disk drives as backup disk drives, which backup disk drives are shared in common by said redundancy groups;

means for identifying one of at least two disk drives in one of said redundancy groups that fails to function; and means for switchably connecting one of said backup disk drives in place of said identified failed disk drive.

17. The system of claim 16 further including:

means for reconstructing said stream of data records written on said identified failed disk drive, using said associated redundancy data; and means for writing said reconstructed stream of data records on to said one backup disk drive.

18. The system of claim 17 wherein said reconstructing means includes:

means for generating said stream of data records written on said identified failed disk drive using said associated redundancy data and data records written on remaining disk drives in said redundancy group.

19. A method of storing data records on one of a plurality of virtual data storage devices identified by at least one associated host processor and located in a disk memory system, which data records are transmitted to said disk memory by said host processor, said disk memory system having a plurality of disk drives, a subset of said plurality of disk drives being configured into at least two redundancy groups, each of which includes at least two disk drives, comprising machine executed steps of:

selecting, in response to a receipt of a stream of data records from said associated host processor, available memory space in one of said redundancy groups to store said received stream of data records thereon;

writing said received stream of data records and redundancy data associated with said received stream of data records in said selected available memory space;

maintaining data indicative of a correspondence between said received stream of data records and an identity of the disk drives in said selected redundancy group on which said received stream of data records is stored;

emulating, in response to said host processor requesting activation of duplex copy group capability for designated primary virtual data storage device and secondary virtual data storage device in said disk memory system, said secondary virtual data storage device including:

storing data indicative of an identity of said designated primary virtual data storage device including said correspondence data which identifies said disk drives on which said received stream of data records is stored, storing data indicative of an identity of said designated secondary virtual data storage device, including data which identifies said disk drives on which said received stream of data records is stored in said designated primary virtual data storage device, and accessing, in response to a query from said host processor to said designated secondary virtual data storage device, said designated primary virtual data storage device.

20. The method of claim 19 wherein said correspondence data comprises a set of pointers which identify said selected available memory space in said selected redundancy group, and said secondary virtual data storage device identity data comprises data indicative of said identity of said designated primary virtual data storage device, wherein said step of emulating further includes:

creating, in response to said host processor transmitting a command to said disk memory system to discontinue duplex copy group operation, data indicative of an identity of said correspondence data for said designated primary virtual data storage device, associating said correspondence data identity data with said designated secondary virtual data storage device, deleting said stored data indicative of an identity of said designated primary virtual data storage device from said secondary virtual data storage device identity data, and interpreting in response to a query from said host processor, said correspondence data as said secondary virtual data storage device.

21. The method of claim 20 wherein said host processor transmits a command to said disk memory system to reestablish said discontinued duplex copy group by deleting one of said primary and secondary virtual data storage devices, said step of emulating further includes:

deleting said correspondence data for said designated deleted virtual data storage device.

22. The method of claim 19 wherein said correspondence data comprises a set of pointers which identify said selected available memory space in said selected redundancy group and said stored secondary virtual data storage device identity data comprises a copy of said correspondence data for said primary virtual data storage device, said step of emulating further comprises:

maintaining, in response to said host processor transmitting a command to said disk memory system to discontinue duplex copy group operation, said primary and secondary virtual data storage device correspondence data independent of each other.

23. The method of claim 19 wherein said correspondence data comprises a set of pointers which identify said selected available memory space in said selected redundancy group, and said secondary virtual data storage device identity data comprises data indicative of said identity of said designated primary virtual data storage device, said step of emulating further includes:
creating, in response to said host processor transmitting a command to said disk memory system to suspend duplex copy group operation, for creating a duplicate copy of said correspondence data for said designated primary virtual data storage device,
associating said copied correspondence data with said designated secondary virtual data storage device,
deleting said stored data indicative of said identity of said designated primary virtual data storage device from said secondary virtual data storage device identity data, and
interpreting, in response to a query from said host processor, said duplicate copy of said correspondence data as said secondary virtual data storage device.

24. The method of claim 19 further comprising machine executed steps of:
writing, in response to a subsequent receipt of modifications to one of said data records stored in said designated primary virtual data storage device from said host processor, said modified data record in one of said memory space in one of said redundancy groups;
converting said memory space used to store an originally received data record to available memory space;
wherein said step of maintaining includes creating correspondence data indicative of the storage of said modified data record in said available memory space.

25. The method of claim 19 further comprising machine executed steps of:
reserving at least one of said plurality of disk drives as backup disk drives, which backup disk drives are shared in common by said redundancy groups;
identifying one of said at least two disk drives in one of said redundancy groups that fails to function; and
switchably connecting one of said backup disk drives in place of said identified failed disk drive.

26. The method of claim 25 further comprising machine executed steps of:
reconstructing said stream of data records written on said identified failed disk drive, using said associated redundancy data; and
writing said reconstructed stream of data records on to said one backup disk drive.

27. The method of claim 26 wherein said step of reconstructing includes;
generating said stream of data records written on said identified failed disk drive using said associated redundancy data and the data records written on remaining disk drives in said redundancy group.

28. A method of storing data records on one of a plurality of virtual data storage devices identified by at least one associated host processor and stored in a disk memory system, which data records are transmitted to said disk memory system by said host processor, said disk memory system includes a plurality of disk drives for storing data thereon, a number of said disk drives being configured into at least two redundancy groups, each said redundancy group including n+m of said plurality of disk drives and configured into at least one virtual data storage device, where n and m are both positive integers with n greater than 1 and m equal to or greater than 1, which data records are accessible by said associated host processor comprising machine executed steps of:
storing each of a plurality of stream of data records received from said associated host processor on successive ones of said n disk drives in a selected one of said redundancy groups;
generating, in response to said storing means storing streams of data records on all n disk drives in said selected redundancy group, m segments of data redundancy information for said data records stored on said n disk drives;
writing said m segments of redundancy data on to said m disk drives of said selected redundancy group;
maintaining data indicative of a correspondence between each of said received streams of data records and an identity of the disk drives in said selected redundancy group on which each of said received streams of data records is stored;
emulating, in response to said host processor requesting activation of duplex copy group capability for designated primary virtual data storage device and secondary virtual data storage device in said disk memory system, said secondary virtual data storage device including:
storing data indicative of an identity of said designated primary virtual data storage device including said correspondence data which identifies said disk drives on which each of said received streams of data records is stored,
storing data indicative of an identity of said designated secondary virtual data storage device, including data which identifies said disk drives on which each of said received streams of data records is stored in said designated primary virtual data storage device, and
accessing, in response to a query from said host processor to said designated secondary virtual data storage device, said disk drives of said designated primary virtual data storage device.

29. The method of claim 28 wherein said correspondence data comprises a set of pointers which identify said selected available memory space in said selected redundancy group, and said secondary virtual data storage device identity data comprises data indicative of said identity of said designated primary virtual data storage device, said step of emulating further includes:
creating, in response to said host processor transmitting a command to said data storage subsystem to suspend duplex copy group operation, for creating a duplicate copy of said correspondence data for said designated primary virtual data storage device,
associating said copied correspondence data with said designated secondary virtual data storage device,
deleting said stored data indicative of said identity of said designated primary virtual data storage device from said secondary virtual data storage device identity data, and interpreting, in response to a query from said host processor, said duplicate copy of said correspondence data as said secondary virtual data storage device.

30. The method of claim 29 wherein said host processor transmits a command to said disk memory system to reestablish said suspended duplex copy group by deleting one of said primary and secondary virtual data storage devices, said step of emulating further includes:
deleting said correspondence data for said designated deleted virtual data storage device.

31. The method of claim 28 wherein said correspondence data comprises a set of pointers which identify a selected available memory space in said selected redundancy group and said stored secondary virtual data storage device identity data comprises a copy of said correspondence data for said primary virtual data storage device, said step of emulating further comprises:
maintaining, in response to said host processor transmitting a command to said disk memory system to discontinue duplex copy group operation, said primary and secondary virtual data storage device correspondence data independent of each other.

32. The method of claim 29 wherein said correspondence data comprises a set of pointers which identify said selected available memory space in said selected redundancy group, and said secondary virtual data storage device identity data comprises data indicative of said identity of said designated primary virtual data storage device, said step of emulating further includes:
creating, in response to said host processor transmitting a command to said disk memory system to suspend duplex copy group operation, for creating data indicative of said identity of said correspondence data for said designated primary virtual data storage device,
associating said correspondence data identity data with said designated secondary virtual data storage device,
deleting said stored data indicative of said identity of said designated primary virtual data storage device from said secondary virtual data storage device identity data, and
interpreting in response to a query from said host processor, said correspondence data as said secondary virtual data storage device.

33. The method of claim 29 further comprising machine executed steps of:
writing, in response to a subsequent receipt of modifications to one of said data records stored in said designated primary virtual data storage device from said host processor, said modified data record in one of said memory space in one of said redundancy groups;
converting said memory space used to store an originally received data record to available memory space;
wherein said step of maintaining includes creating correspondence data indicative of storage of said modified data record in said available memory space.

34. The method of claim 28 further comprising machine executed steps of:
reserving at least one of said plurality of disk drives as backup disk drives, which backup disk drives are shared in common by said redundancy groups;
identifying one of said disk drives in one of said redundancy groups that fails to function; and
switchably connecting one of said backup disk drives in place of said identified failed disk drive.

35. The method of claim 34 further comprising machine executed steps of:
reconstructing said stream of data records written on said identified failed disk drive, using said associated redundancy data; and
writing said reconstructed stream of data records on to said one backup disk drive.

36. The method of claim 35 wherein said step of reconstructing includes;
generating said stream of data records written on said identified failed disk drive using said associated redundancy data and data records written on remaining disk drives in said redundancy group.

* * * * *